United States Patent
Park et al.

(10) Patent No.: US 11,914,416 B2
(45) Date of Patent: Feb. 27, 2024

(54) TRANSMITTER CIRCUIT AND METHOD OF OPERATING SAME

(71) Applicant: SAMSUNG ELECTRONICS CO., LTD., Suwon-si (KR)

(72) Inventors: Junyoung Park, Seongnam-si (KR); Joohwan Kim, Seoul (KR); Jindo Byun, Suwon-si (KR); Eunseok Shin, Seoul (KR); Hyunyoon Cho, Uiwang-si (KR); Youngdon Choi, Seoul (KR); Junghwan Choi, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 17/737,575

(22) Filed: May 5, 2022

(65) Prior Publication Data
US 2022/0382317 A1    Dec. 1, 2022

(30) Foreign Application Priority Data

May 26, 2021  (KR) .................. 10-2021-0067896
Sep. 8, 2021  (KR) .................. 10-2021-0119857

(51) Int. Cl.
*H03K 3/00*    (2006.01)
*G06F 1/06*    (2006.01)
*H03K 3/017*    (2006.01)
*H03K 19/20*    (2006.01)

(52) U.S. Cl.
CPC .............. *G06F 1/06* (2013.01); *H03K 3/017* (2013.01); *H03K 19/20* (2013.01)

(58) Field of Classification Search
CPC ...... G06F 1/06; G06F 13/4291; G06F 13/385; H03K 3/017; H03K 19/20; H03K 19/1737; H03K 19/01855; H03K 19/018521; H03M 9/00; H04L 25/0286
USPC ........................................................ 327/101
See application file for complete search history.

(56) References Cited

U.S. PATENT DOCUMENTS

| | | | |
|---|---|---|---|
| 6,194,950 B1 | 2/2001 | Kibar et al. |
| 7,321,603 B1 | 1/2008 | Broekaert |
| 7,460,039 B2 | 12/2008 | Jeon |
| 7,876,245 B2 | 1/2011 | Lee |
| 8,085,082 B2 | 12/2011 | Penzes |

(Continued)

FOREIGN PATENT DOCUMENTS

| | | |
|---|---|---|
| EP | 2779458 A1 | 9/2014 |
| KR | 10-1845326 | 4/2018 |
| WO | WO 2016-118348 A1 | 7/2016 |

OTHER PUBLICATIONS

European Search Report dated Dec. 7, 2022 Cited in Corresponding EP Patent Application No. 22172018.8.

(Continued)

*Primary Examiner* — Ryan Jager
(74) *Attorney, Agent, or Firm* — Fish & Richardson P.C.

(57) ABSTRACT

A transmitter circuit that receives parallel signals and outputs a serial signal in response to the parallel signals may include; a clock generator generating first clock signals having different respective phases, a multiplexer including selection circuits respectively configured to selectively provide at least two of the parallel signals to an output node in response to at least two of the first clock signals, and an output driver generating the serial signal by amplifying a signal at the output node.

12 Claims, 14 Drawing Sheets

(56) References Cited

U.S. PATENT DOCUMENTS

| | | | |
|---|---|---|---|
| 8,525,770 B2* | 9/2013 | Shin | G09G 3/2092 |
| | | | 345/98 |
| 9,214,202 B2 | 12/2015 | Shim et al. | |
| 9,503,115 B1* | 11/2016 | Shin | H03M 1/0836 |
| 9,806,717 B2 | 10/2017 | Bowles et al. | |
| 10,560,097 B1 | 2/2020 | Peng et al. | |
| 10,797,725 B2* | 10/2020 | Kim | H03M 9/00 |
| 10,931,305 B2 | 2/2021 | Choi et al. | |
| 2006/0262065 A1* | 11/2006 | Luo | G09G 3/2096 |
| | | | 345/98 |
| 2007/0024476 A1* | 2/2007 | Saeki | H03M 9/00 |
| | | | 341/101 |
| 2008/0036509 A1* | 2/2008 | Jang | H03K 5/135 |
| | | | 327/141 |
| 2012/0128092 A1* | 5/2012 | Lai | H04L 27/3427 |
| | | | 375/295 |
| 2019/0165790 A1* | 5/2019 | Choi | H03K 7/08 |
| 2019/0238156 A1 | 8/2019 | Kim | |
| 2020/0195274 A1* | 6/2020 | Kim | H03M 9/00 |

OTHER PUBLICATIONS

Partial Search Report Dated Nov. 3, 2022 Cited in Corresponding EP Patent Application No. 22172018.8.
Extended European Search Report in European Appln. No. 23183217.1, dated Sep. 29, 2023, 13 pages.

* cited by examiner

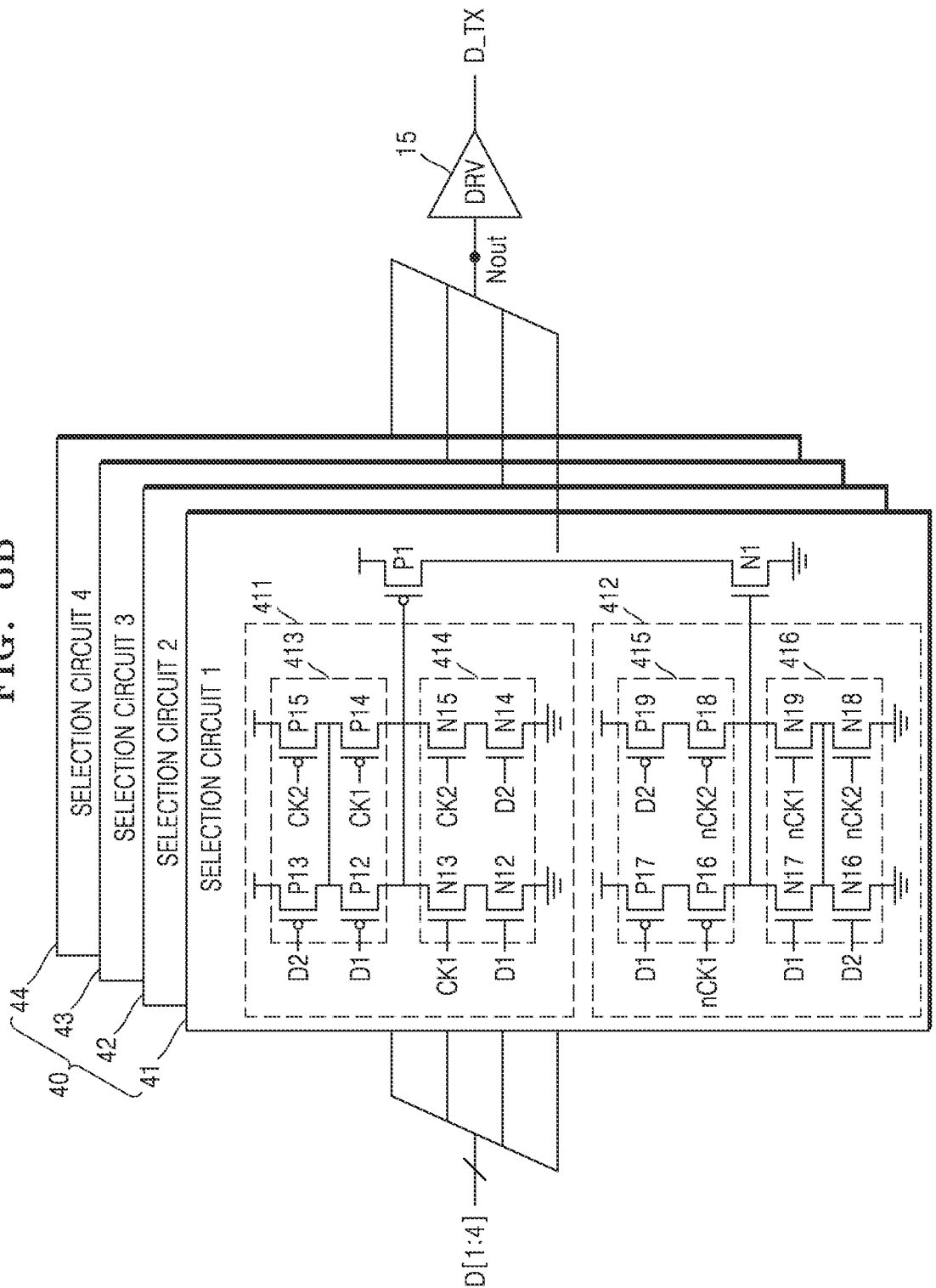

TRANSMITTER CIRCUIT AND METHOD OF OPERATING SAME

CROSS-REFERENCE TO RELATED APPLICATION

This application claims priority under 35 U.S.C. § 119 to Korean Patent Application No. 10-2021-0067896 filed on May 26, 2021, and Korean Patent Application No. 10-2021-0119857 filed on Sep. 8, 2021, the collective subject matter of which is hereby incorporated by reference in its entirety.

BACKGROUND

The inventive concept relates generally to transmitter circuits, and more particularly, to transmitter circuits including two or more selection circuits driving an output node. The inventive concept also relates to methods of operating such transmitter circuits.

A transmitter circuit may include a serializer that generates a serial signal by sequentially outputting a plurality of parallel signals. The serializer may sequentially output the plurality of parallel signals in response to a plurality of clock signals, each having a different respective phase. However, performance of the serializer may be reduced due to skew occurring between the plurality of clock signals.

SUMMARY

Embodiments of the inventive concept provide a transmitter circuit capable of increasing a slew rate of a serial signal by driving two or more selection circuits. Other embodiments of the inventive concept provide a method of operating this type of transmitter circuit.

According to an aspect of the inventive concept, a transmitter circuit that receives parallel signals and outputs a serial signal in response to the parallel signals may include; a clock generator configured to generate first clock signals having different respective phases, a multiplexer including selection circuits respectively configured to selectively provide at least two of the parallel signals to an output node in response to at least two of the first clock signals, and an output driver configured to generate the serial signal by amplifying a signal at the output node.

According to an aspect of the inventive concept, a transmitter circuit that receives parallel signals and outputs a serial signal in relation to the parallel signals may include; a clock generator configured to generate first clock signals having different respective phases, selection circuits configured to receive a transition signal indicating whether the serial signal transitions and at least one of the parallel signals and drive an output node in response to the first clock signals, the transition signal, and the at least one of the parallel signals, and an output driver configured to generate the serial signal by amplifying a signal at the output node, wherein at least two of the selection circuits simultaneously drive the output node in response to whether the serial signal transitions.

According to an aspect of the inventive concept, a method of operating a transmitter circuit to generate a serial signal from parallel signals may include; generating first clock signals having different respective phases in response to a reference clock signal, sequentially outputting the parallel signals by simultaneously driving an output node using at least two selection circuits among a plurality of selection circuits, wherein each of the at least two selection circuits operates in response to at least one of the first clock signals and receives at least two of the parallel signals, and generating the serial signal by amplifying a signal at the output node.

BRIEF DESCRIPTION OF THE DRAWINGS

Advantages and features, as well as the making and use of the inventive concept may be more clearly understood upon consideration of the following detailed description together with the accompanying drawings, in which:

FIGS. 8A, 8B and 8C are respective circuit diagrams illustrating various structures for selection circuits according to embodiments of the inventive concept;

DETAILED DESCRIPTION

Throughout the written description and drawings, like or similar elements, components, features and/or method steps are denoted by like reference numbers and/or labels.

Figure 1:
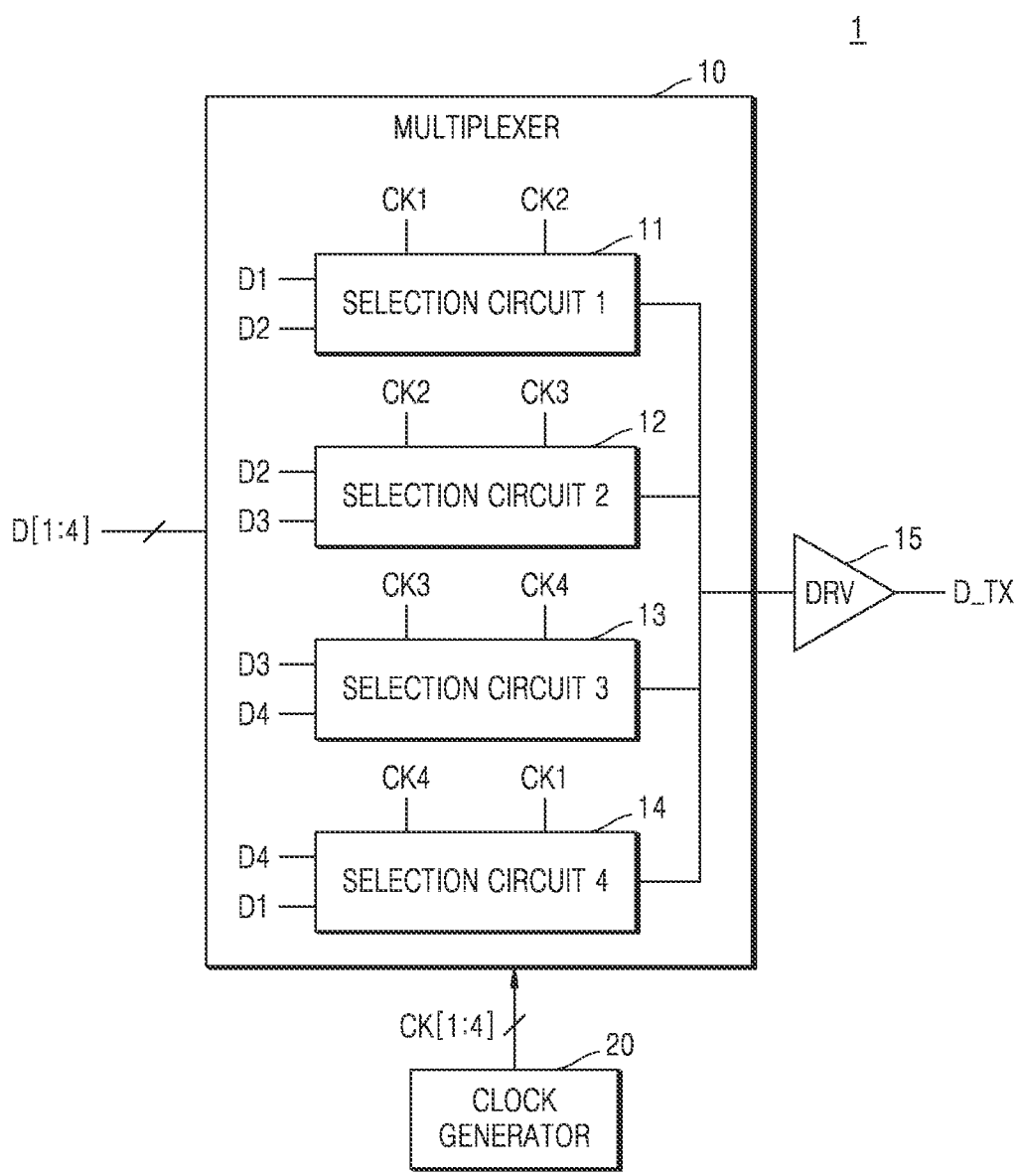
FIG. 1 is a block diagram illustrating a transmitter circuit according to embodiments of the inventive concept.
Figure 2:
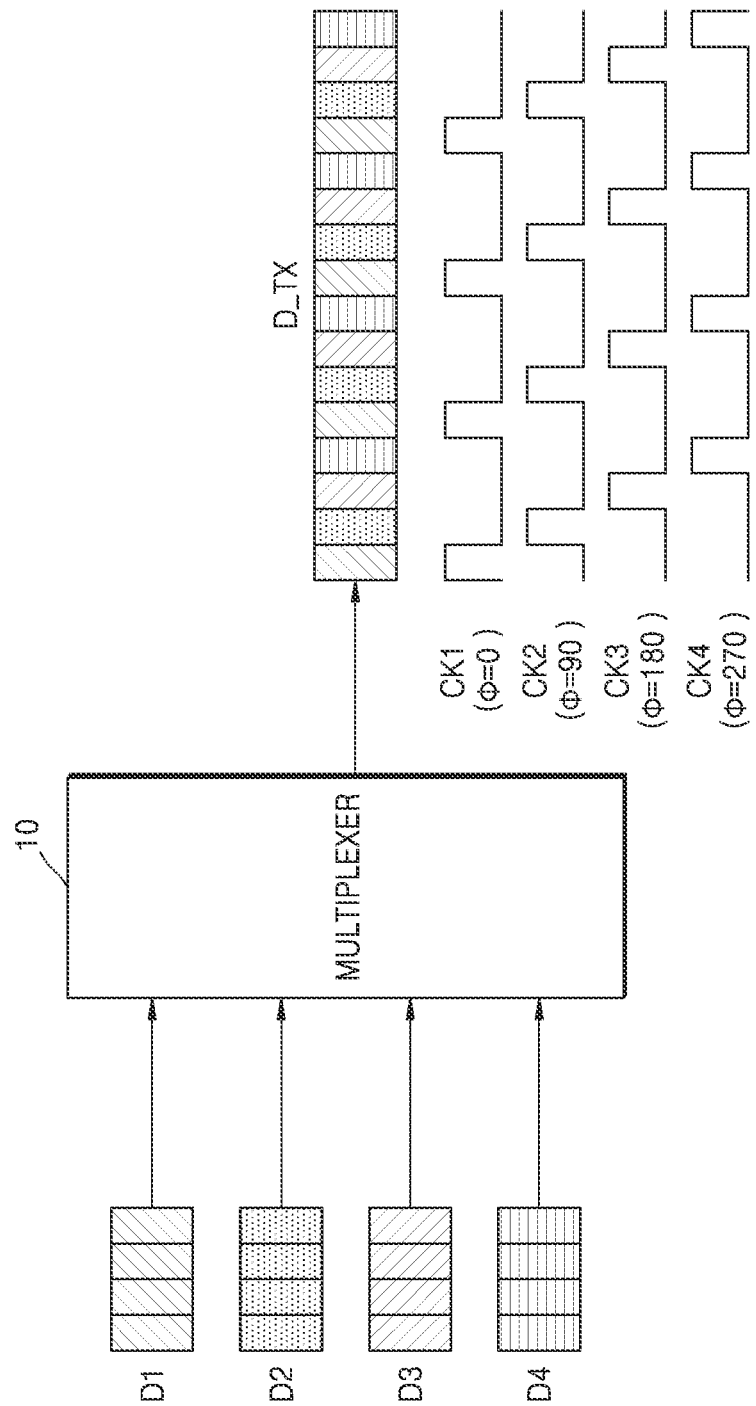
FIG. 2 is a conceptual diagram illustrating a serializing operation according to embodiments of the inventive concept.

Figure (FIG. 1 is a diagram illustrating a transmitter circuit 1 according to embodiments of the inventive concept, and FIG. 2 is a conceptual diagram illustrating a serializing operation according to embodiments of the inventive concept.

Referring to FIG. 1, the transmitter circuit 1 may receive first, second, third and fourth (hereafter collectively, "first to fourth") as parallel signals D[1:4] and output a serial signal D_TX. The first to fourth parallel signals D[1:4] may be transmitted (or applied) to a multiplexer 10 through different channels, and the serial signal D_TX may be externally output (or provided) through a single channel. Although four (4) parallel signals are illustrated in the working example, those skilled in the art will recognize that any reasonable number 'N' of parallel signals may be used, where N is a positive integer greater than 1.

As shown in FIG. 1, the transmitter circuit 1 may generally include an output driver 15 and a clock generator 20 in addition to the multiplexer 10. Here, the multiplexer 10 may be understood as outputting the first to fourth parallel signals D[1:4] in response to first to fourth clock signals CK1 to CK4.

Thus, referring to FIG. 2, the multiplexer 10 may output a first parallel signal D1 in response to the first clock signal CK1, output a second parallel signal D2 in response to the second clock signal CK2, output a third parallel signal D3 in response to the third clock signal CK3, and a fourth parallel signal D4 in response to the fourth clock signal CK4. That is, the multiplexer 10 may perform a serializing operation for converting the first to fourth parallel signals D[1:4] into a single serial signal D_TX.

The multiplexer 10 may include first to fourth selection circuits 11 to 14. Each of the first to fourth selection circuits 11 to 14 may receive two or more of the parallel signals, as well as two or more of the clock signals. In response, each of the first to fourth selection circuits 11 to 14 may output a corresponding parallel signal in response to either an active level (e.g., a logic high level (hereafter "high") or a logic low level (hereafter, "low")) or an active edge (e.g., a rising edge or a falling edge) of the clock signal. For example, the first selection circuit 11 may output the first parallel signal D1 in response to an active edge of the first clock signal CK1 and may output the second parallel signal D2 in response to an active edge of the second clock signal CK2. The second selection circuit 12 may output the second parallel signal D2 in response to the active edge of the second clock signal CK2 and output the third parallel signal D3 in response to an active edge of the third clock signal CK3. The third selection circuit 13 may output the third parallel signal D3 in response to the active edge of the third clock signal CK3 and output the fourth parallel signal D4 in response to an active edge of the fourth clock signal CK4. The fourth selection circuit 14 may output the first parallel signal D1 in response to the active edge of the first clock signal CK1 and output the fourth parallel signal D4 in response to the active edge of the fourth clock signal CK4. Although four clock signals are illustrated in the working example for convenience of description, those skilled in the art will recognize that any reasonable number 'N' of clock signals and/or 'N' parallel signals may be applied to the multiplexer 10 in order to generate the serial signal D_TX by performing a serializing operation on the N parallel signals in response to (or based on) the N clock signals.

Of note, any one parallel signal may be input to two or more selection circuits and may be output from the two or more selection circuits in response to corresponding clock signal(s).

Although the multiplexer 10 of FIG. 1 is illustrated as including four (4) selection circuits for convenience of description, those skilled in the art will recognize that any reasonable number of selection circuits may be used. For example, the multiplexer 10 may include N selection circuits, wherein each of the N selection circuits may receive two or more parallel signals and two or more clock signals in order to selectively output two or more parallel signals based on the two or more clock signals.

The clock generator 20 may be used to generate the first to fourth clock signals CK[1:4] assumed in the illustrated example of FIGS. 1 and 2. Duty ratios of the first to fourth clock signals CK[1:4] may be inversely proportional to the number of selection circuits included in the multiplexer 10. For example, given that the number of selection circuits included in the multiplexer 10 is four (4), the duty ratios of the first to fourth clock signals CK[1:4] may be about 25%. Alternately, assuming that the number of selection circuits included in the multiplexer 10 is five (5), the duty ratios of the first to fifth clock signals CK[1:5] provided by the clock generator 20 may be about 20%. Thus, the term "duty ratio" may represent a ratio of time periods of an active signal in a single cycle.

Further of note, the first to fourth clock signals CK[1:4] may have different phases. For example, referring to FIG. 2, a phase of the first clock signal CK1 may be about 0□, a phase of the second clock signal CK2 may be about 90□, a phase of the third clock signal CK3 may be about 180□, and a phase of the fourth clock signal CK4 may be about 270□. However, those skilled in the art will recognize that the clock generator 20 may generate any reasonable of clock signals having any reasonable, constant phase difference.

Referring to FIG. 1, the output driver 15 may be used to generate the serial signal D_TX by amplifying a signal received from the multiplexer 10. Thus, consistent with the foregoing working assumptions, the serial signal D_TX may have a signal pattern in which the first to fourth parallel signals D[1:4] are repeatedly arranged.

Accordingly, consistent with the foregoing explanation of the transmitter circuit 1 of FIG. 1, embodiments of the inventive concept may use two or more selection circuits to output the same parallel signal in response to at least one clock signal, wherein a slew rate of the signal transmitted to the output driver 15 may be increased. That is, two or more selection circuits may be used to collectively drive an output node with an output signal having a relatively higher high slew rate.

Figure 3:
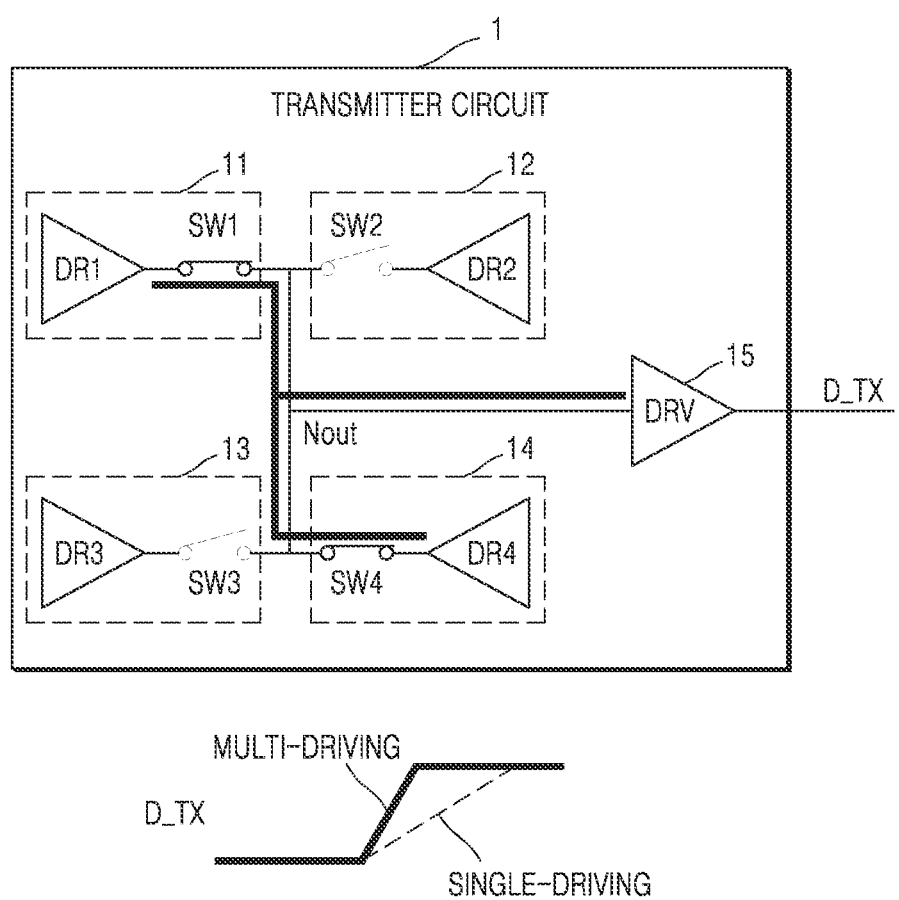
FIG. 3 is a conceptual diagram illustrating a multi-driving operation according to embodiments of the inventive concept.

FIG. 3 is a conceptual diagram illustrating a multi-driving operation in the context of the transmitter circuit 1 of FIGS. 1 and 2.

Referring to FIGS. 1, 2 and 3, the transmitter circuit 1 is again assumed to include the first to fourth selection circuits 11 to 14 and the output driver 15, wherein the first to fourth selection circuits 11 to 14 receive the first to fourth parallel signals D[1:4] and are configured to selectively output the first to fourth parallel signals D[1:4] in response to the first to fourth clock signals CK[1:4].

The first to fourth selection circuits 11 to 14 may drive an output node Nout according to logic levels (e.g., high or low) of the received parallel signals. That is, when the parallel signals are at a logic high level, the first to fourth selection circuits 11 to 14 may precharge the output node Nout, and when the parallel signals are at a logic low level, the first to fourth selection circuits 11 to 14 may discharge the output node Nout.

In this regard, Each of the first to fourth selection circuits 11 to 14 may be understood as including a driver and a switch. For example, the first selection circuit 11 may include a first driver DR1 and a first switch SW1. The second selection circuit 12 may include a second driver DR2 and a second switch SW2. The third selection circuit 13 may include a third driver DR3 and a third switch SW3. The fourth selection circuit 14 may include a fourth driver DR4 and a fourth switch SW4. The first driver DR1 may output the first or second parallel signals D1 or D2, and the first switch SW1 may be controlled by the first clock signal CK1 or the second clock signal CK2. That is, the first switch SW1 may be turned ON according to an active level of the first clock signal CK1, and the first parallel signal D1 output from the first driver DR1 may be transmitted to the output node Nout.

Two or more of the first to fourth selection circuits 11 to 14 may output the same parallel signal in response to one clock signal. For example, the first switch SW1 and the fourth switch SW4 may be turned ON according to the active level of the first clock signal CK1, and the first driver DR1 and the fourth driver DR4 may transmit the first parallel signal D1 to the output node Nout. That is, the transmitter circuit 1 may generate the serial signal D_TX by simultaneously driving two or more selection circuits.

When the selection circuit is viewed from the output node Nout, each of the first to fourth selection circuits 11 to 14 may be understood as a capacitor. According to embodiments of the inventive concept, when two or more selection circuits simultaneously drive the output node Nout, a value of output capacitance viewed from the output node Nout toward the selection circuit may be reduced. When the value of the output capacitance is reduced, a slew rate of the serial signal D_TX may be increased. For example, as illustrated in FIG. 3, when a multi-driving operation in which two or more selection circuits simultaneously drive the output node Nout is performed, a slew rate of the output node Nout may be increased. An operation in which one of the first to fourth selection circuits 11 to 14 drives the output node Nout may be referred to as a single-driving operation.

Compared with the single-driving operation, a slew rate of the serial signal DTX may be increased according to the multi-driving operation. Accordingly, the performance of the transmitter circuit 1 may be increased.

Figure 4A:
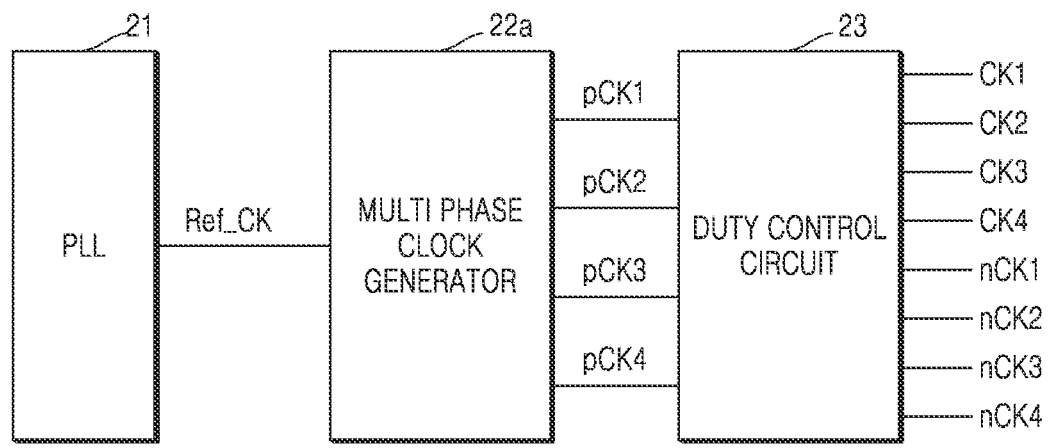
FIGS. 4A and 4B are respective block diagrams illustrating clock generators according to embodiments of the inventive concept.
Figure 4B:
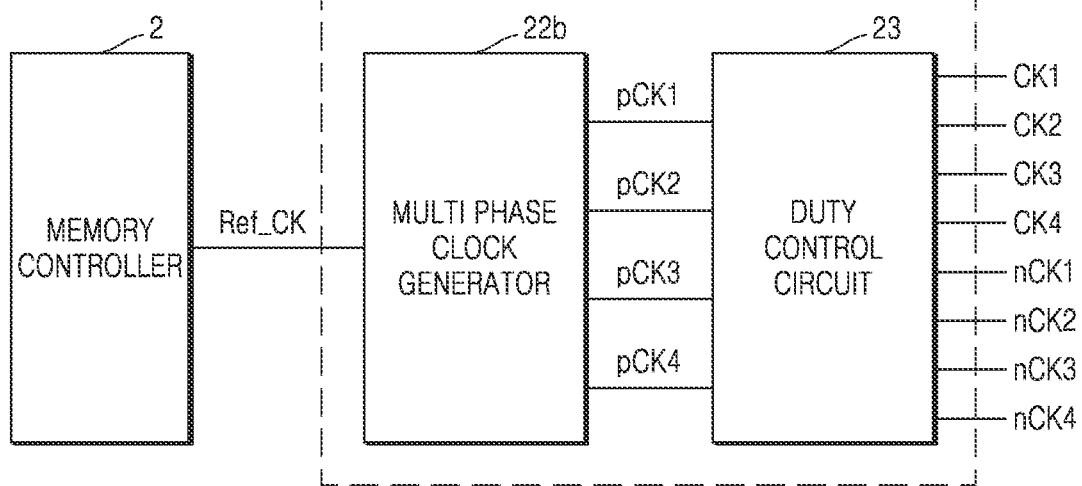

FIGS. 4A and 4B are respective block diagrams illustrating clock generators 20a and 20b according to embodiments of the inventive concept.

Referring to FIG. 4A, the clock generator 20a may include a phase locked loop (PLL) 21, a multi phase clock generator 22a, and a duty control circuit 23. The clock generator 20a may be an example of the clock generator 20 of FIG. 1.

The PLL 21 may generate a reference clock signal Ref_CK and transmit the reference clock signal Ref_CK to the multi phase clock generator 22a. A duty ratio of the reference clock signal Ref_CK may be about 50%.

The multi phase clock generator 22a may generate first to fourth multi phase clock signals pCK1 to pCK4 with different phases in response to the reference clock signal Ref_CK. For example, a phase of the first multi phase clock signal pCK1 may be about 0□, a phase of the second multi phase clock signal pCK2 may be about 90□, and a phase of the third multi phase clock signal pCK3 may be about 180□, and a phase of the fourth multi phase clock signal pCK4 may be about 270□. The multi phase clock generator 22a may include a delay locked loop (DLL).

The duty control circuit 23 may generate first to fourth clock signals CK1 to CK4 and first to fourth inverted clock signals nCK1 to nCK4 based on the first to fourth multi phase clock signals pCK1 to pCK4. Duty ratios of the first to fourth clock signals CK1 to CK4 and duty ratios of the first to fourth inverted clock signals nCK1 to nCK4 may be different from duty ratios of the first to fourth multi phase clock signals pCK1 to pCK4. For example, the duty ratios of the first to fourth clock signals CK1 to CK4 and the duty ratios of the first to fourth inverted clock signals nCK1 to nCK4 may be about 25%.

The first to fourth inverted clock signals nCK1 to nCK4 may be, respectively, inverted logic versions of the first to fourth clock signals CK1 to CK4.

Referring to FIG. 4B, the clock generator 20b may receive a reference clock signal Ref_CK from a memory controller 2, and generate first to fourth clock signals CK1 to CK4 and first to fourth inverted clock signals nCK1 to nCK4 in response to the reference clock signal Ref_CK. The clock generator 20b may be an example of the clock generator 20 of FIG. 1.

In some embodiments, the clock generator 20b may be included in a semiconductor memory device (e.g., 1300 of FIG. 13), and the memory controller 2 may transmit the reference clock signal Ref_CK to the semiconductor memory device 1300. In some embodiments, the reference clock signal Ref_CK may be referred to as a write clock (WCK) signal. The semiconductor memory device 1300 may generate a serial signal by performing a serializing operation based on the WCK signal and may transmit the generated serial signal to the memory controller 2.

Figure 5:
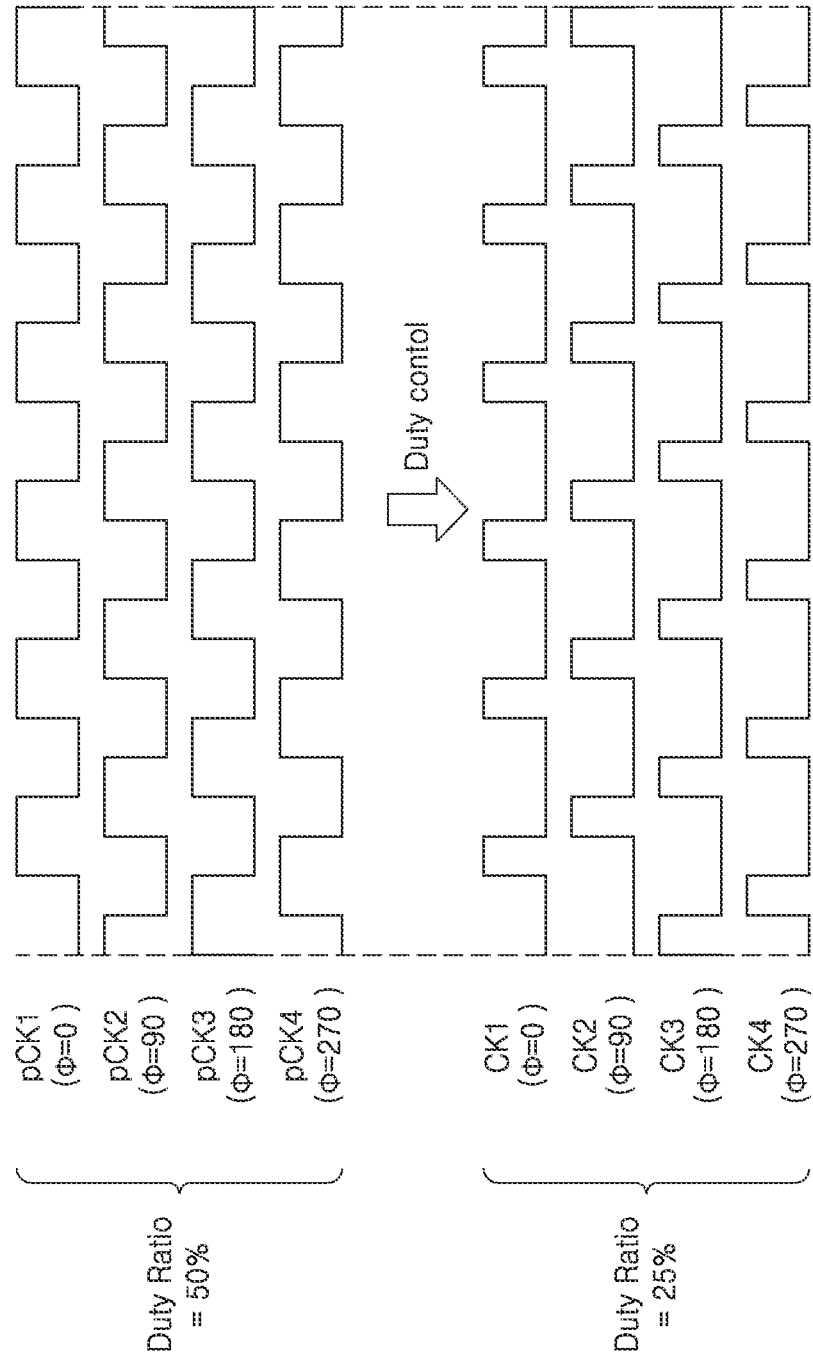
FIG. 5 is a waveform diagram illustrating a duty ratio change operation according to embodiments of the inventive concept.
Figure 6:
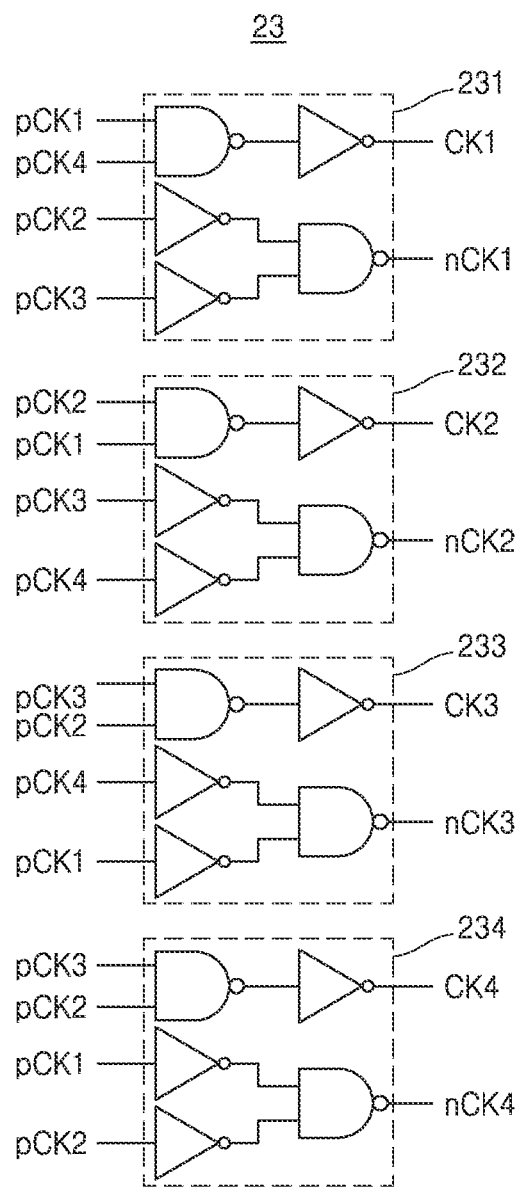
FIG. 6 is a circuit diagram illustrating a duty control circuit according to embodiments of the inventive concept.

FIG. 5 is a waveform diagram illustrating a duty ratio change operation according to embodiments of the inventive concept, and FIG. 6 is a circuit diagram of a duty control circuit according to embodiments of the inventive concept.

Referring to FIG. 5, duty ratios of the first to fourth multi phase clock signals pCK1 to pCK4 may be about 50%. A phase of the first multi phase clock signal pCK1 may be about 0□, a phase of the second multi phase clock signal pCK2 may be about 90□, a phase of the third multi phase clock signal pCK3 may be about 180□, and a phase of the fourth multi phase clock signal pCK4 may be about 270□.

Referring to FIGS. 4 and 6, the duty control circuit 23 may generate the first to fourth clock signals CK1 to CK4 based on the first to fourth multi phase clock signals pCK1 to pCK4. Duty ratios of the first to fourth clock signals CK1 to CK4 may be about 25%. Although not illustrated in FIG. 5, the duty control circuit 23 may generate the first to fourth inverted clock signals nCK1 to nCK4, and the first to fourth inverted clock signals nCK1 may have opposite phases to the first to fourth clock signals CK1 to CK4.

Referring to FIG. 6, the duty control circuit 23 may include first to fourth clock generation circuits 231 to 234. The first clock generation circuit 231 may generate the first clock signal CK1 and the first inverted clock signal nCK1, the second clock generation circuit 232 may generate the second clock signal CK2 and the second inverted clock signal nCK2, the third clock generation circuit 233 may generate the third clock signal CK3 and the third inverted clock signal nCK3, and the fourth clock generation circuit 234 may generate the fourth clock signal CK4 and the fourth inverted clock signal nCK4. Each of the first to fourth clock generation circuits 231 to 234 may receive the first to fourth multi phase clock signals pCK1 to pCK4.

The first clock generation circuit 231 may generate the first clock signal CK1 by performing a NAND operation on the first multi phase clock signal pCK1 and the fourth multi phase clock signal pCK4 and inverting the result of the NAND operation. That is, as a result, the first clock signal CK1 may be obtained by an AND operation between the first multi phase clock signal pCK1 and the fourth multi phase clock signal pCK4 with a phase difference of about 270□ therebetween. The first clock generation circuit 231 may invert the second multi phase clock signal pCK2 and the third multi phase clock signal pCK3 and generate the first inverted clock signal nCK1 by performing a NAND operation on the inverted signals. That is, as a result, the first inverted clock signal nCK1 may be obtained by performing an OR operation on the second multi phase clock signal pCK2 and the third multi phase clock signal pCK3 with a phase difference of about 90□ therebetween.

The second clock generation circuit 232 to the fourth clock generation circuit 234 may operate in like manner as the first clock generation circuit 231, and thus, detailed description on the second clock generation circuit 232 to the fourth clock generation circuit 234 is omitted.

Examples of generating the first to fourth clock signals CK1 to CK4 and the first to fourth inverted clock signals nCK1 to nCK4 are not limited to only the foregoing, and a plurality of clock signals with adjusted duty ratios and inverted signals of the plurality of clock signals may be generated in various ways according to various embodiments of the inventive concept.

Figure 7:
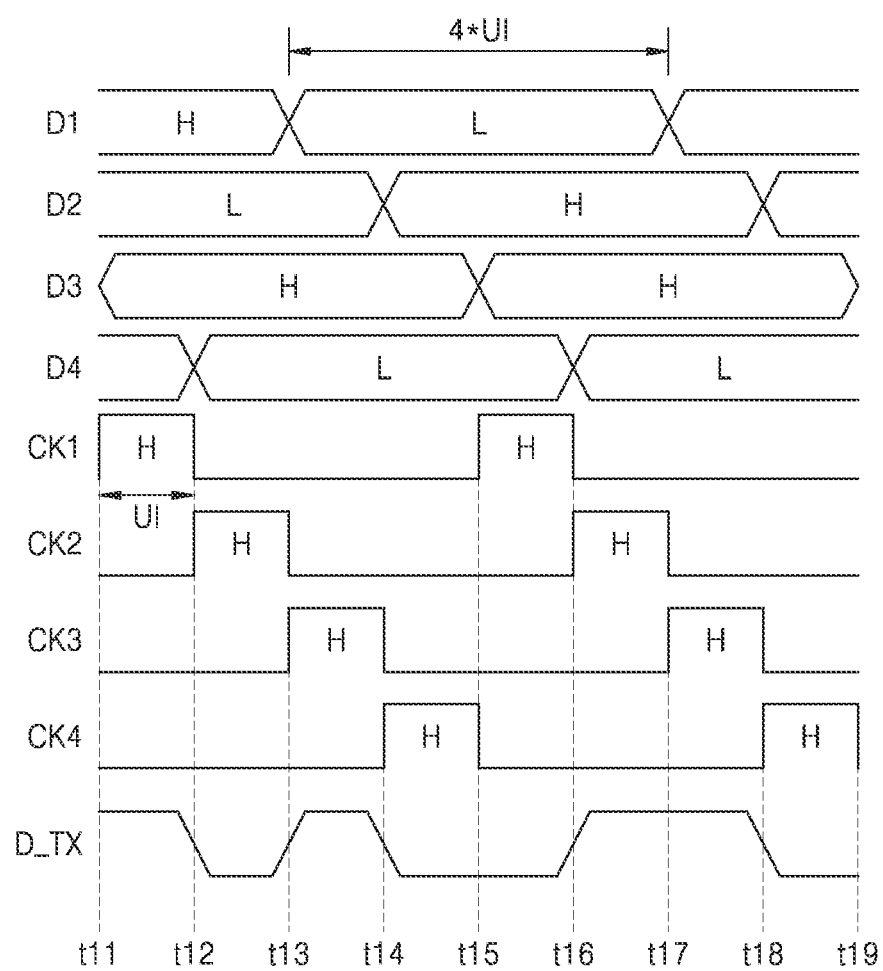
FIG. 7 is a timing diagram illustrating a serializing process according to embodiments of the inventive concept.

FIG. 7 is a timing diagram further illustrating a serializing process according to embodiments of the inventive concept.

Referring to FIG. 7 in the context of the embodiment illustrated in FIG. 1, the first to fourth clock signals CK1 to CK4 may maintain a high during a defined unit interval (UI). The first to fourth parallel signals D[1:4] may maintain high for a preset UI to be synchronized with active edge timing of the first to fourth clock signals CK1 to CK4. For example, the first to fourth parallel signals D[1:4] may maintain the same logic level (e.g., high or low) for a time corresponding to four times the UI.

The multiplexer 10 may output the first parallel signal D1 as the serial signal D_TX in response to an active edge of the first clock signal CK1 at time ti Because the first parallel signal D1 is high, the serial signal D_TX may also be high. The multiplexer 10 may output the second parallel signal D2 as the serial signal D_TX in response to an active edge of the second clock signal CK2 at time t12. Because the second parallel signal D2 is low, the serial signal D_TX may transition to low. As illustrated in FIG. 1, the first selection circuit 11 and the second selection circuit 12 may simultaneously output the second parallel signal D2 in response to the second clock signal CK2. Accordingly, when the serial signal D_TX transitions at time t12, a slew rate thereof may be increased. Similarly, the serial signal D_TX may transition at time t13, a fourth point at time t14, a sixth point at time t16, and an eighth point at time t18, and two or more selection circuits simultaneously drive the serial signal D_TX. In this manner, a corresponding slew rate may be increased.

That is, the two selection circuits output the same parallel signal in response to each of the first to fourth clock signals CK1 to CK4, and thus, the slew rate of the serial signal D_TX may be increased, and the performance of the transmitter circuit 1 may be improved. However, embodiments of the inventive concept are not limited to this particular approach. For example, three or more selection circuits may output the same parallel signal in response to each of the first to fourth clock signals CK to CK4 in order to improve the performance of the transmitter circuit 1.

Figure 8A:
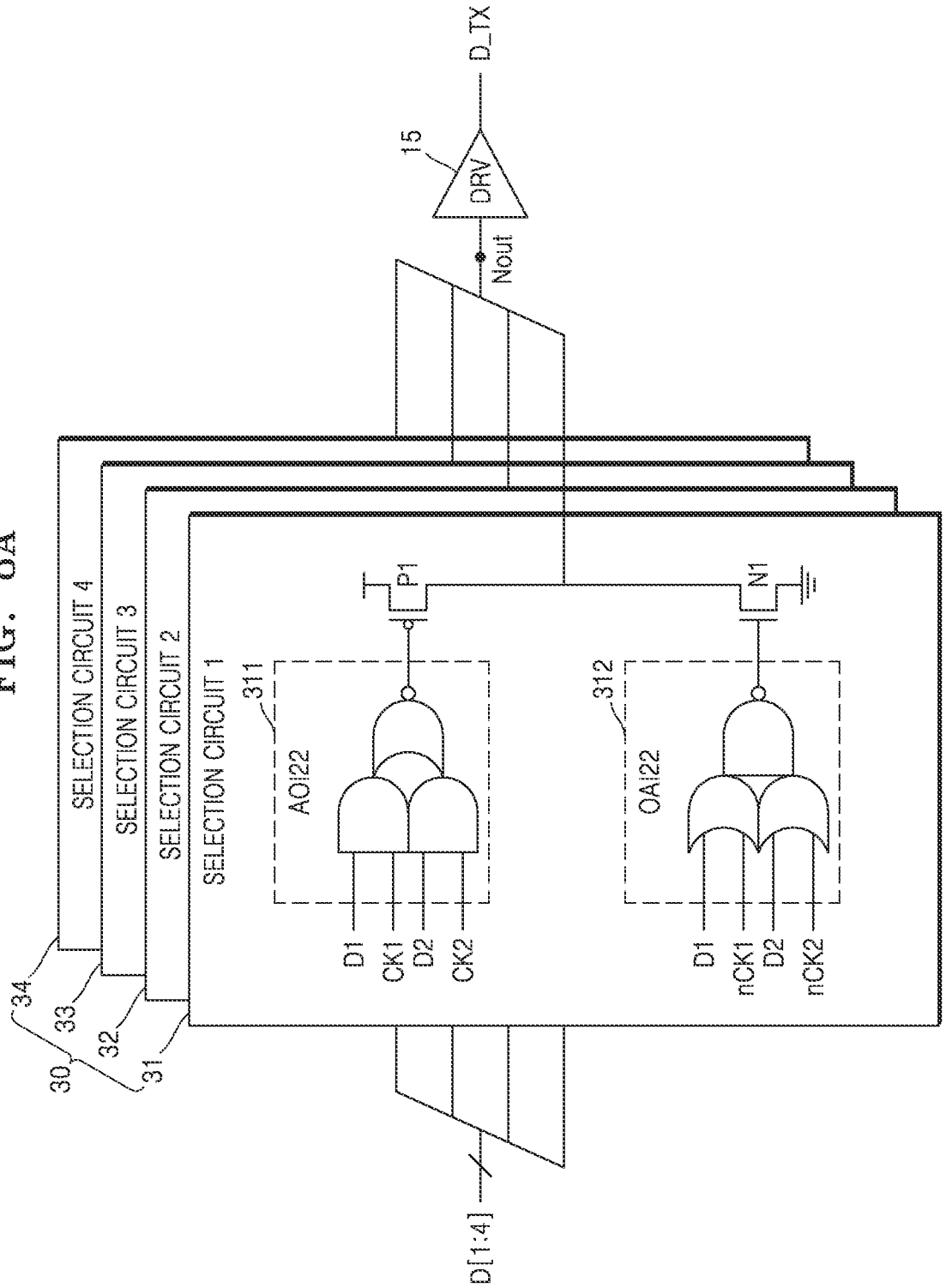
Figure 8C:
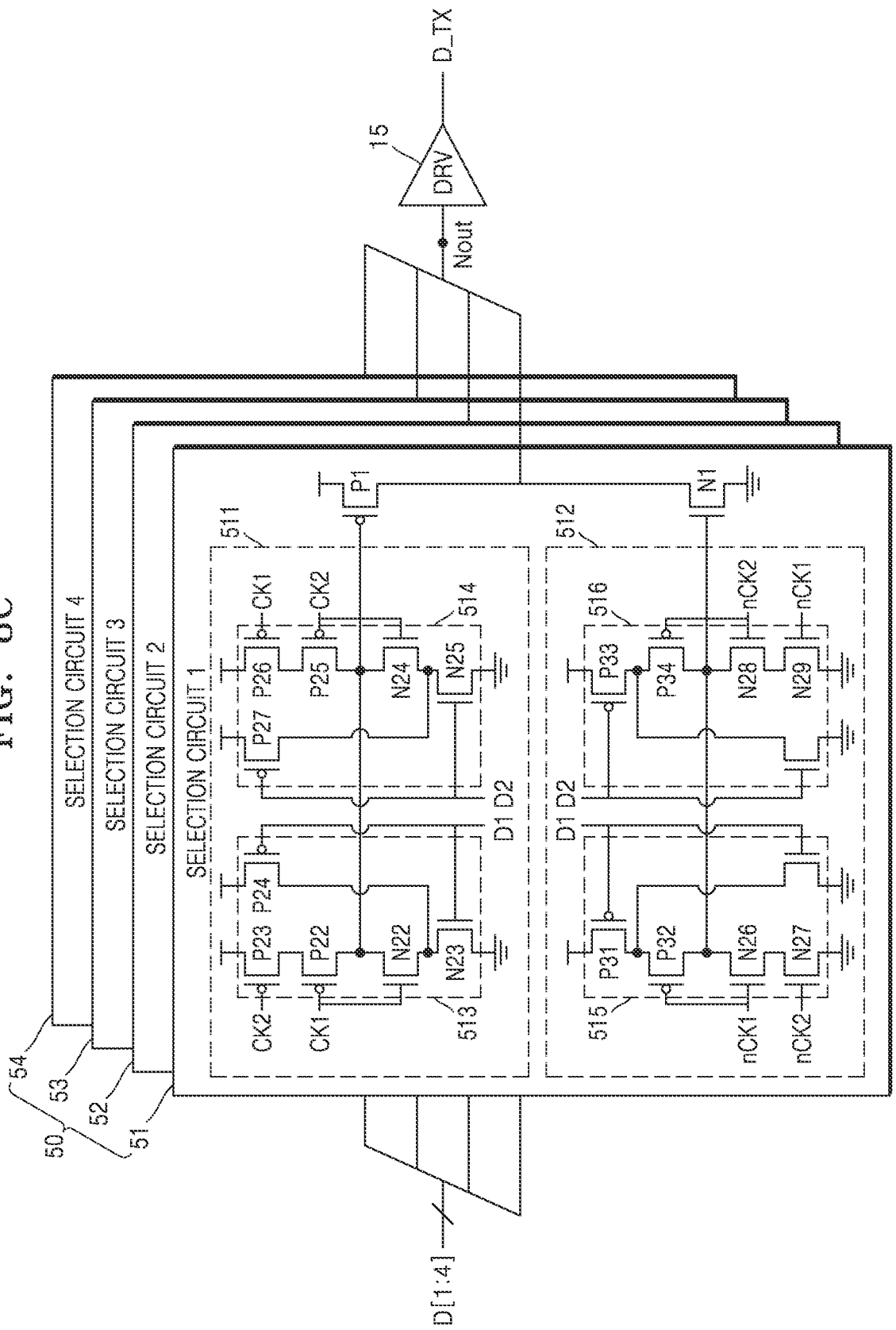

FIGS. 8A, 8B and 8C are respective circuit diagrams variously illustrating structures of selection circuits according to embodiments of the inventive concept. Here, FIG. 8A is a circuit diagram illustrating a selection circuit at a logic gate level, while FIGS. 8B and 8C are circuit diagrams illustrating selection circuits at a transistor level.

Referring to FIG. 8A, a multiplexer 30 may include first to fourth selection circuits 31 to 34. The following description on the first selection circuit 31 may also be applied to the second to fourth selection circuits 32 to 34.

The first selection circuit 31 may include an AND-OR-inverter (AOI22) circuit 311, an OR-AND-inverter (OAI22) circuit 312, a first P-type transistor P1, and a first N-type transistor N1.

The AOI22 circuit 311 may receive the first and second parallel signals D1 and D2 and the first and second clock signals CK1 and CK2 and drive a gate terminal of the first P-type transistor P1. That is, the AOI22 circuit 311 may turn ON the first P-type transistor P1 by inverting the first parallel signal D1 to high in response to an active edge (e.g., a rising edge) of the first clock signal CK1. Alternately, the AOI22 circuit 311 may turn ON the first P-type transistor P1 by inverting the second parallel signal D2 to high in response to an active edge of the second clock signal CK2. As the first P-type transistor P1 is turned ON, a high serial signal D_TX may be generated. That is, the first selection circuit 31 may generate the serial signal D_TX by outputting first and second parallel signals D1 and D2 at high in response to the first and second clock signals CK1 and CK2.

The OAI22 circuit 312 may receive the first and second parallel signals D1 and D2 and the first and second inverted clock signals nCK1 and nCK2 and drive a gate terminal of the first N-type transistor N1. That is, the OAI22 circuit 312 may turn ON the first N-type transistor N1 by inverting the first parallel signal D1 to low in response to an active edge (e.g., a falling edge) of the first inverted clock signal nCK1. As the first N-type transistor N1 is turned ON, a low serial signal D_TX may be generated. That is, the first selection circuit 31 may generate the serial signal D_TX by outputting the first and second parallel signals D1 and D2 at low in response to the first and second inverted clock signals nCK1 and nCK2.

The second selection circuit 32 may generate the serial signal D_TX by outputting the second and third parallel signals D2 and D3 at high in response to the second and third clock signals CK2 and CK3, or by outputting the second and third parallel signals D2 and D3 at low in response to the second and third inverted clock signals nCK2 and nCK3. The third selection circuit 33 may generate the serial signal D_TX by outputting the third and fourth parallel signals D3 and D4 at high in response to the third and fourth clock signals CK3 and CK4, or by outputting the third and fourth parallel signals D3 and D4 at low in response to the third and fourth inverted clock signals nCK3 and nCK4. The fourth selection circuit 34 may generate the serial signal D_TX by outputting the first and fourth parallel signals D1 and D4 at high in response to the first and fourth clock signals CK1 and CK4, or by outputting the first and fourth parallel signals D1 and D4 at low in response to the first and fourth inverted clock signals nCK1 and nCK4. That is, the first to fourth parallel signals D1 to D4 may be simultaneously selected by at least two or more selection circuits to configure the serial signal D_TX.

However, embodiments of the inventive concept are not limited thereto, and a multiplexer structure in which one parallel signal is simultaneously output by two or more selection circuits may be included in certain embodiments of the inventive concept. In addition, according to embodiments of the inventive concept, one selection circuit may receive two or more parallel signals and output one of the two or more parallel signals in response to each of two or more clock signals.

Referring to FIG. 8B, a multiplexer 40 may include first to fourth selection circuits 41 to 44. In FIG. 8B, description on the first selection circuit 41 may be similarly applied to the second to fourth selection circuits 42 to 44.

The first selection circuit 41 may include an AOI22 circuit 411 and an OAI22 circuit 412. The AOI22 circuit 411 may drive a first P-type transistor P1 such that high first and second parallel signals D1 and D2 are output as the serial signal D_TX in response to the first and second clock signals CK1 and CK2. The OAI22 circuit 412 may drive a first N-type transistor N1 such that low first and second parallel signals D1 and D2 are output as the serial signal D_TX in response to the first and second inverted clock signals nCK1 and nCK2.

The AOI22 circuit 411 may include a first pull-up circuit 413 and a first pull-down circuit 414. The first pull-up circuit 413 may pre-charge a node connected to a gate terminal of the first P-type transistor P1, and the first pull-down circuit 414 may discharge a node connected to the gate terminal of the first P-type transistor P1.

The first pull-up circuit 413 may include second to fifth P-type transistors P12 to P15. The first parallel signal D1 may be input to a gate terminal of the second P-type transistor P12, the second parallel signal D2 may be input to a gate terminal of the third P-type transistor P13, the first clock signal CK1 may be input to a gate terminal of the fourth P-type transistor P14, and the second clock signal CK2 may be input to a gate terminal of the fifth P-type transistor P15. The first pull-down circuit 414 may include second to fifth N-type transistors N12 to N15. When the first clock signal CK1 is high and the first parallel signal D1 is high, the first P-type transistor P1 may be turned ON by the second to fifth N-type transistors N12 to N15, and thus, the serial signal D_TX may be high. In addition, when the second clock signal CK2 is high and the second parallel signal D2 is high, the first P-type transistor P1 may be turned ON, and thus, the serial signal D_TX may be high. That is, the AOI22 circuit 411 may drive the first P-type transistor P1 such that high first and second parallel signals D1 and D2 are output in the serial signal D_TX.

The OAI22 circuit 412 may include a second pull-up circuit 415 and a second pull-down circuit 416. The second pull-up circuit 415 may pre-charge a node connected to a gate terminal of the first N-type transistor N1, and the second pull-down circuit 416 may discharge a node connected to a gate terminal of the first N-type transistor N1.

The second pull-down circuit 416 may include sixth to ninth N-type transistors N16 to N19. The sixth to ninth N-type transistor N16 to N19 may be connected to the gate terminal of the first N-type transistor N1. The sixth to ninth N-type transistor N16 to N19 may be controlled by the first parallel signal D1, the second parallel signal D2, the first and second inverted signals nCK1 and nCK2. The sixth to ninth N-type transistor N16 to N19 may not discharge the gate terminal of the first N-type transistor N1 while the second pull-up circuit 415 precharges the gate terminal of the first N-type transistor N1.

The second pull-up circuit 415 may include sixth to ninth P-type transistors P16 to P19. The first inverted clock signal nCK1 may be input to a gate terminal of the sixth P-type transistor P16, the first parallel signal D1 may be input to a gate terminal of the seventh P-type transistor P17, the second inverted clock signal nCK2 may be input to a gate terminal of the eighth P-type transistor P18, and the second parallel signal D2 may be input to a gate terminal of the ninth P-type transistor P19. When the first inverted clock signal nCK1 is low, that is, when the first clock signal CK1 is high and the first parallel signal D1 is low, the first N-type transistor N1 may be turned ON, and thus, the serial signal D_TX may be low. In addition, when the second inverted clock signal nCK2 is low, that is, when the second clock signal CK2 is high and the second parallel signal D2 is low, the first N-type transistor N1 may be turned ON, and thus, the serial signal D_TX may be low. That is, the OAI22 circuit 412 may drive the first N-type transistor N1 such that low first and second parallel signals D1 and D2 are output in the serial signal D_TX.

Although it has been assumed that the first selection circuit 41 outputs the first and second parallel signals D1 and D2 in response to the first and second clock signals CK1 and CK2, embodiments of the inventive concept are not limited thereto. That is, the first selection circuit 41 may selectively output three or more parallel signals in response to three or more clock signals. In addition, parallel signals received by the first selection circuit 41 are not limited to the first and second parallel signals D1 and D2.

Referring to FIG. 8C, a multiplexer 50 may include first to fourth selection circuits 51 to 54. In FIG. 8C, description on the first selection circuit 51 may be applied to the second to fourth selection circuits 52 to 54.

The first selection circuit 51 may include an AOI22 circuit 511 and an OAI22 circuit 512. The AOI22 circuit 511 may drive the first P-type transistor P1 such that high first and second parallel signals D1 and D2 are output as the serial signal D_TX in response to the first and second clock signals CK1 and CK2. The OAI22 circuit 512 may drive the first N-type transistor N1 such that low first and second parallel signals D1 and D2 are output as the serial signal D_TX in response to the first and second inverted clock signals nCK1 and nCK2.

The AOI22 circuit 511 may include a first drive circuit 513 and a second drive circuit 514. The first drive circuit 513 may drive a node connected to a gate terminal of the first P-type transistor P1 based on a first input signal D1, and the second drive circuit 514 may drive a node connected to the gate terminal of the first P-type transistor P1 in response to a second input signal D2.

The first drive circuit 513 may include second to fourth P-type transistors P22 to P24 and second and third N-type transistors N22 and N23. The first clock signal CK1 may be input to a gate terminal of the second P-type transistor P22, the second clock signal CK2 may be input to a gate terminal of the third P-type transistor P23, the first parallel signal D1 may be input to a gate terminal of the fourth P-type transistor P24, the first clock signal CK1 may be input to a gate terminal of the second N-type transistor N22, and the first parallel signal D1 may be input to a gate terminal of the third N-type transistor N23. When the first clock signal CK1 is high and the first parallel signal D1 is high, the first P-type transistor P1 may be turned ON by the first drive circuit 513, and thus, the serial signal D_TX may be high.

The second drive circuit 514 may include fifth to seventh P-type transistors P25 to P27 and fourth and fifth N-type transistors N24 and N25. The second clock signal CK2 may be input to a gate terminal of the fifth P-type transistor P25, the first clock signal CK1 may be input to a gate terminal of the sixth P-type transistor P26, the second parallel signal D2 may be input to a gate terminal of the seventh P-type transistor P27, the second clock signal CK2 may be input to a gate terminal of the fourth N-type transistor N24, and the second parallel signal D2 may be input to a gate terminal of the fifth N-type transistor N25. When the second clock signal CK2 is high and the second parallel signal D2 is high, the first P-type transistor P1 may be turned ON by the second drive circuit 514, and thus, the serial signal D_TX may be high.

The OAI22 circuit 512 may include a third drive circuit 515 and a fourth drive circuit 516. The third drive circuit 515 may drive a node connected to a gate terminal of the first N-type transistor N1 in response to the first input signal D1, and the fourth drive circuit 516 may a node connected to the gate terminal of the first N-type transistor N1 in response to the second input signal D2.

The third drive circuit 515 may include eighth and ninth P-type transistors P31 to P32 and sixth and seventh N-type transistors N26 and N27. The first parallel signal D1 may be input to a gate terminal of the eighth P-type transistor P31, the first inverted clock signal nCK1 may be input to a gate terminal of the ninth P-type transistor P32, the first inverted clock signal nCK1 may be input to a gate terminal of the sixth N-type transistor N26, and the second inverted clock signal nCK2 may be input to a gate terminal of the seventh N-type transistor N27. When the first inverted clock signal nCK1 is low, that is, when the first clock signal CK1 is high and the first parallel signal D1 is low, the first N-type transistor N1 may be turned ON by the third drive circuit 515, and thus, the serial signal D_TX may be low.

The fourth drive circuit 516 may include tenth and eleventh P-type transistors P33 to P34 and eighth and ninth N-type transistors N28 and N29. The second parallel signal D2 may be input to a gate terminal of the tenth P-type transistor P33, the second inverted clock signal nCK2 may be input to a gate terminal of the eleventh P-type transistor P34, the second inverted clock signal nCK2 may be input to a gate terminal of the eighth N-type transistor N28, and the first inverted clock signal nCK1 may be input to a gate terminal of the ninth N-type transistor N29. When the second inverted clock signal nCK2 is low, that is, when the second inverted signal CK2 is high and the second parallel signal D2 is low, the first N-type transistor N1 may be turned ON by the fourth drive circuit 516, and thus, the serial signal D_TX may be low.

Figure 9:
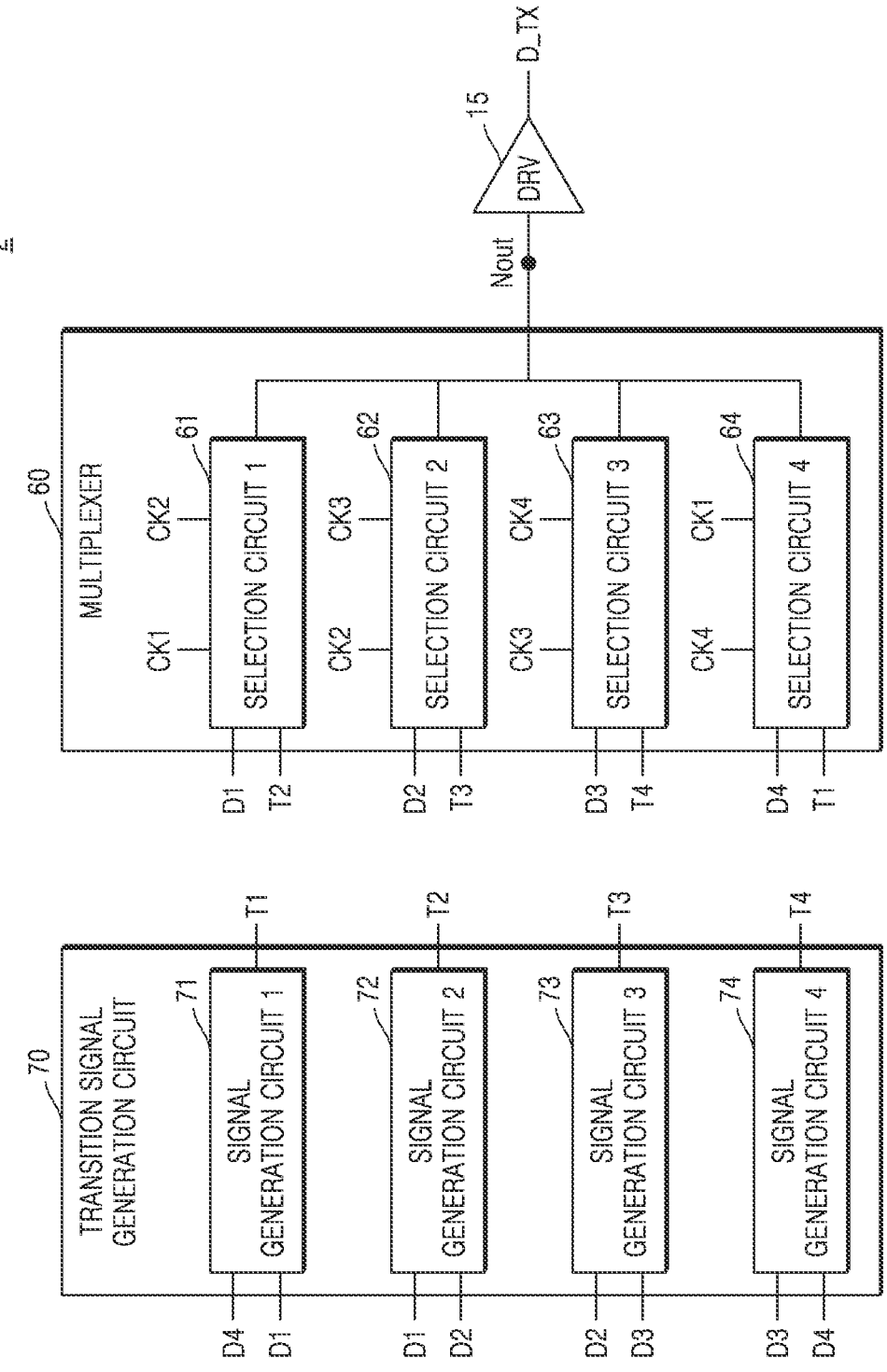
FIG. 9 is a block diagram illustrating a transmitter circuit according to embodiments of the inventive concept.
Figure 10:
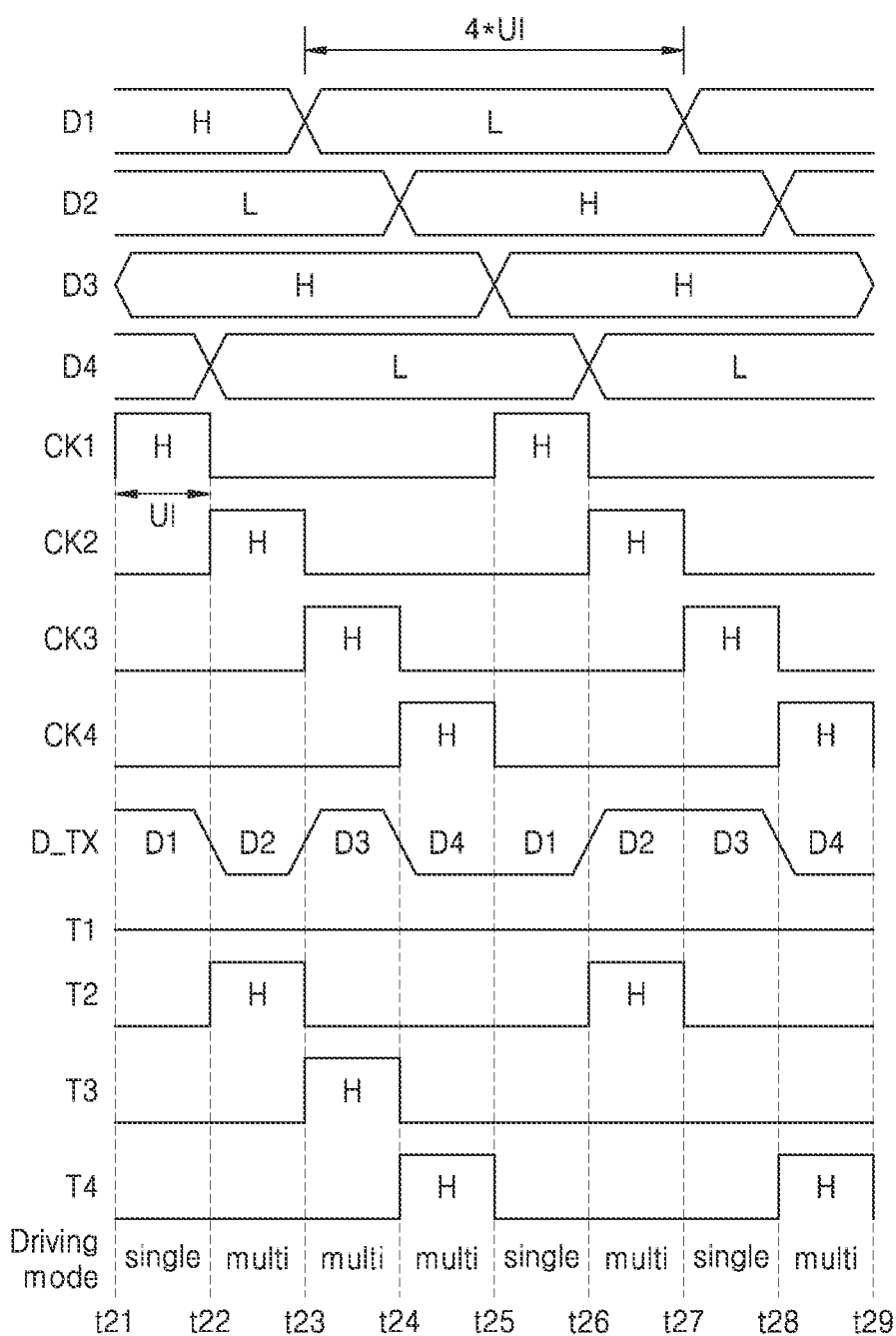
FIG. 10 is a timing diagram illustrating operation of a transmitter circuit according to embodiments of the inventive concept.

FIG. 9 is a block diagram illustrating a transmitter circuit 2 according to embodiments of the inventive concept, and FIG. 10 is a timing diagram illustrating operation of the transmitter 2.

Referring to FIG. 9, the transmitter circuit 2 may include a multiplexer 60, a transition signal generation circuit 70, and an output driver 15.

The multiplexer 60 may selectively output the first to fourth parallel signals D1 to D4, and the output driver 15 amplifies an output of the multiplexer 60 to generate the serial signal D_TX.

The multiplexer 60 may include first to fourth selection circuits 61 to 64. The first to fourth selection circuits 61 to 64 may receive the parallel signals D1 to D4 and first to fourth transition signals T1 to T4. For example, the first selection circuit 61 may receive the first parallel signal D1 and the second transition signal T2, the second selection circuit 62 may receive the second parallel signal D2 and the third transition signal T3, the third selection circuit 63 may receive the third parallel signal D3 and the fourth transition signal T4, and the fourth selection circuit 64 may receive the fourth parallel signal D4 and the first transition signal T1.

Referring to FIG. 10, the multiplexer 60 may output the first to fourth parallel signals D1 to D4 based on the first to fourth clock signals CK1 to CK4 sequentially transitions to a logic high level H, and thus, the serial signal D_TX may be generated.

Referring to FIGS. 9 and 10, the transition signal generation circuit 70 may generate first to fourth transition signals T1 to T4 indicating whether the serial signal D_TX transitions. When the serial signal D_TX transitions, one of the first to fourth transition signals T1 to T4 may be at a logic high level, and the other transition signals may be at a logic low level.

The transition signal generation circuit 70 may include first to fourth signal generation circuits 71 to 74.

The first signal generation circuit 71 may generate the first transition signal T1 in response to the first and fourth parallel signals D1 and D4. That is, the first transition signal T1 may indicate whether there is a logic level transition (e.g., high to low, or low to high) between a section of the fourth parallel signal D4 and a section of the first parallel signal D1 adjacent to each other in the serial signal D_TX. For example, in FIG. 10, there is no logic level transition between the section of the fourth parallel signal D4 and the section of the first parallel signal D1 adjacent to each other in the serial signal D_TX at time t25, and thus, the first transition signal T1 may be low.

The second signal generation circuit 72 may generate the second transition signal T2 based on the first parallel signal D1 and the second parallel signal D2. That is, the second transition signal T2 may indicate whether there is a logic level transition between a section of the first parallel signal D1 and a section of the second parallel signal D2 adjacent to each other in the serial signal D_TX. For example, in FIG. 10, there are logic level transitions between the sections of the first parallel signal D1 and the sections of the second parallel signal D2 adjacent to each other in the serial signal D_TX at time t22 and at time t26. Thus, the second transition signal T2 may maintain high for a preset time (e.g., the UI).

The third signal generation circuit 73 may generate the third transition signal T3 in response to the second parallel signal D2 and the third parallel signal D3. That is, the third transition signal T3 may indicate whether there is a logic level transition between a section of the second parallel signal D2 and a section of third parallel signal D3 adjacent to each other in the serial signal D_TX. For example, in FIG. 10, there is a logic level transition between the section of the second parallel signal D2 and the section of the third parallel signal D3 adjacent to each other in the serial signal D_TX at time t23. Thus, the third transition signal T3 may maintain high for a preset time (e.g., the UI). There is no logic level transition between the section of the second parallel signal D2 and the section of the third parallel signal D3 adjacent to each other in the serial signal D_TX at time t27. Thus, the third transition signal T3 may be low.

The fourth signal generation circuit 74 may generate the fourth transition signal T4 in response to the third parallel signal D3 and the fourth parallel signals D4. That is, the fourth transition signal T4 may indicate whether there is a logic level transition between a section of the third parallel signal D3 and a section of the fourth parallel signal D4 adjacent to each other in the serial signal D_TX. For example, in FIG. 10, there are logic level transitions between the sections of the third parallel signal D3 and the sections of the fourth parallel signal D4 adjacent to each other in the serial signal D_TX at time t24 and at time t28. Thus, the fourth transition signal T4 may maintain high for a preset time (e.g., the UI).

The first selection circuit 61 may select the first parallel signal D1 or the second transition signal T2 in response to active levels (e.g., highs) or active edges (e.g., rising edges) of the first and second clock signals CK1 and CK2. That is, the first selection circuit 61 may output the first parallel signal D1 in response to an active edge of the first clock signal CK1. In addition, the first selection circuit 61 may drive an output node Nout in response to the second transition signal T2 further in response to an active edge of the second clock signal CK2. The first selection circuit 61 may not drive the output node when a logic level of the second transition signal T2 is low, and drive the output node Nout when the logic level of the second transition signal T2 is high. For example, when a logic level transitions from a section in which the first parallel signal D1 is high to a section in which the second parallel signal D2 is low, the logic level of the second transition signal T2 is high. The first selection circuit 61 may discharge the output node Nout in response to the second transition signal T2 further in response to the active edge of the second clock signal CK2. Alternately, when a logic level transitions from a section in which the first parallel signal D1 is low to a section in which the second parallel signal D2 is high, the logic level of the second transition signal T2 is high. The first selection circuit 61 may precharge the output node Nout based on the second transition signal T2 in response to the active edge of the second clock signal CK2.

That is, when there is a logic level transition between a section of the first parallel signal D1 and a section of the second parallel signal D2 included in the serial signal D_TX, the first selection circuit 61 drives (e.g., precharges or discharges) the output node Nout together with the second selection circuit 62, a slew rate of the serial signal D_TX may be increased.

The second selection circuit 62 may select the second parallel signal D2 or the third transition signal T3 in response to active levels (e.g., highs) or active edges (e.g., rising edges) of the second clock signal CK2 and the third clock signal CK3. That is, the second selection circuit 62 may output the second parallel signal D2 in response to the active edge of the second clock signal CK2. In addition, the second selection circuit 62 may drive the output node Nout in response to the third transition signal T3 in response to the active edge of the third clock signal CK3. The second selection circuit 62 may not drive the output node Nout when a logic level of the third transition signal T3 is low and may drive the output node Nout when the logic level of the third transition signal T3 is high. For example, when a logic level transitions from a section in which the second parallel signal D2 is high to a section in which the third parallel signal D3 is low, the logic level of the third transition signal T3 is high. The second selection circuit 62 may discharge the output node Nout based on the third transition signal T3 in response to the active edge of the third clock signal CK3. Alternately, when a logic level transitions from a section in which the second parallel signal D2 is low to a section in which the third parallel signal D3 is high, the logic level of the third transition signal T3 is high. The second selection circuit 62 may precharge the output node Nout based on the third transition signal T3 in response to the active edge of the third clock signal CK3.

That is, when there is a logic level transition between a section of the second parallel signal D2 and a section of the third parallel signal D3 included in the serial signal D_TX, the second selection circuit 62 drives the output node Nout together with the third selection circuit 63, a slew rate of the serial signal D_TX may be increased.

The third selection circuit 63 may select the third parallel signal D3 or the fourth transition signal T4 in response to active levels (e.g., highs) or active edges (e.g., rising edges) of the third clock signal CK3 and the fourth clock signal CK4. That is, the third selection circuit 63 may output the third parallel signal D3 in response to the active edge of the third clock signal CK3. In addition, the third selection circuit 63 may drive the output node Nout in response to the fourth transition signal T4 further in response to the active edge of the fourth clock signal CK4. The third selection circuit 63 may not drive the output node Nout when a logic level of the fourth transition signal T4 is low and may drive the output node Nout when the logic level of the fourth transition signal T4 is high. For example, when a logic level transitions from a section in which the third parallel signal D3 is high to a section in which the fourth parallel signal D4 is low, the logic level of the fourth transition signal T4 is high. The third selection circuit 63 may discharge the output node Nout in response to the fourth transition signal T4 further in response to the active edge of the fourth clock signal CK4. Alternately, when a logic level transitions from a section in which the third parallel signal D3 is low to a section in which the fourth parallel signal D4 is high, the logic level of the fourth transition signal T4 is high. The third selection circuit 63 may precharge the output node Nout in response to the fourth transition signal T4 further in response to the active edge of the fourth clock signal CK4.

That is, when there is a logic level transition between a section of the third parallel signal D3 and a section of the fourth parallel signal D4 included in the serial signal D_TX, the third selection circuit 63 drives the output node Nout together with the fourth selection circuit 64, a slew rate of the serial signal D_TX may be increased.

The fourth selection circuit 64 may select the fourth parallel signal D4 or the first transition signal T1 in response to active levels (e.g., highs) or active edges (e.g., rising edges) of the fourth clock signal CK4 and the first clock signal CK1. That is, the fourth selection circuit 64 may output the fourth parallel signal D4 in response to the active edge of the fourth clock signal CK4. In addition, the fourth selection circuit 64 may drive the output node Nout in response to the first transition signal T1 further in response to the active edge of the first clock signal CK1. The fourth selection circuit 64 may not drive the output node Nout when a logic level of the first transition signal T1 is low and may drive the output node Nout when the logic level of the first transition signal T1 is high. For example, when a logic level transitions from a section in which the fourth parallel signal D4 is high to a section in which the first parallel signal D1 is low, the logic level of the first transition signal T1 is high. The fourth selection circuit 64 may discharge the output node Nout based on the first transition signal T1 in response to the active edge of the first clock signal CK1. Alternately, when a logic level transitions from a section in which the fourth parallel signal D4 is low to a section in which the first parallel signal D1 is high, the logic level of the first transition signal T1 is high. The fourth selection circuit 64 may precharge the output node Nout based on the first transition signal T1 in response to the active edge of the first clock signal CK1.

That is, when there is a logic level transition between a section of the fourth parallel signal D4 and a section of the first parallel signal D1 included in the serial signal D_TX, the fourth selection circuit 64 drives the output node Nout together with the first selection circuit 61, a slew rate of the serial signal D_TX may be increased.

According to embodiments of the inventive concept, when a logic level of the serial signal D_TX transitions, a multi-driving operation that a plurality of selection circuits drive an output node is performed, the slew rate of the serial signal D_TX may be increased. For example, referring to FIG. 10, one of the first to fourth transition signals T1 to T4 may have an active edge at time t22, at time t23, at time t24, at time t26, and at time t28, and the transmitter circuit 2 may operate in a multi-driving mode in which a plurality of selection circuits drive the output node.

In addition, when a logic level of the serial signal D_TX does not transition, a single-driving operation in which one selection circuit drives the output node is performed, and thus, power consumption is reduced. For example, referring to FIG. 10, the first to fourth transition signals T1 to T4 do not have active edges at time t21, time t25, and time t27, and thus, the transmitter circuit 2 may operate in a single-driving mode in which one selection circuit drives the output node.

Figure 11:
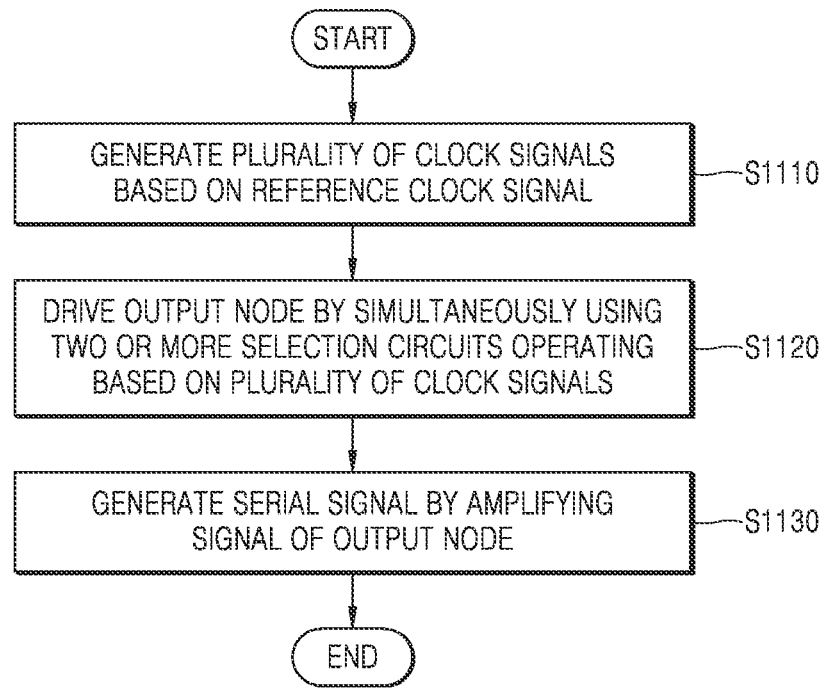
FIG. 11 is a flowchart illustrating a method of operating a transmitter circuit according to embodiments of the inventive concept.

FIG. 11 is a flowchart illustrating a method of operating a transmitter circuit according to embodiments of the inventive concept.

Referring to FIGS. 1, 4A, 4B and 6, the clock generator 20 may generate a plurality of clock signals CK[1:4] having different phases in response to a reference clock signal (S1110). A duty ratio of the reference clock signal may be about 50%, and duty ratios of the plurality of clock signals CK[1:4] may be less than about 50%. For example, the duty ratios of the plurality of clock signals CK[1:4] may be about 25%.

The multiplexer 10 may drive an output node by simultaneously using two or more of the first and fourth selection circuits 11 to 14 operating in response to the plurality of clock signals CK[1:4] (S1120). That is, as illustrated in FIGS. 1 and 3, the first and fourth selection circuits 11 and 14 may simultaneously provide the first parallel signal D1 to the output node Nout in response to the first clock signal CK1. Because two or more selection circuits drive an output node, a slew rate of the serial signal D_TX may be increased, and the performance of the transmitter circuit 1 may be increased.

The output driver 15 may then generate the serial signal D_TX by amplifying a signal of the output node Nout (S1130).

Figure 12:
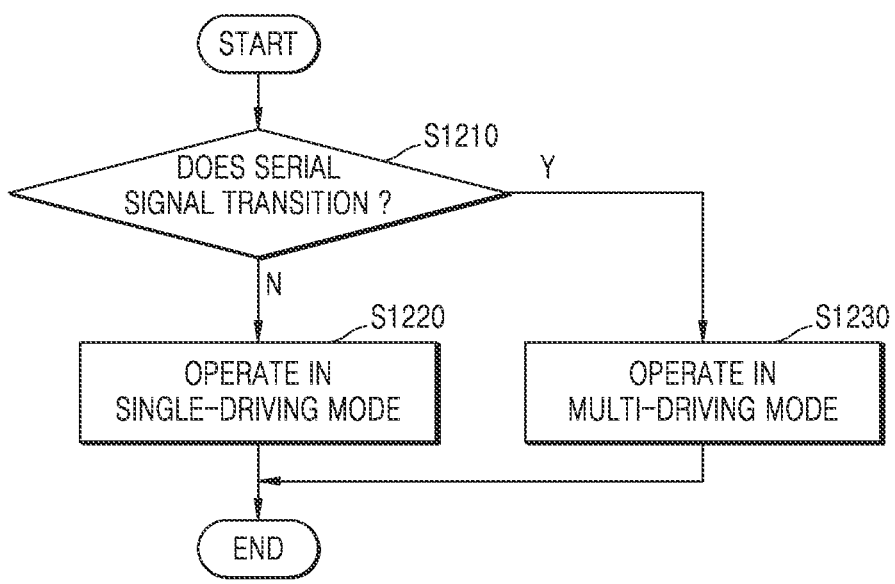
FIG. 12 is a flowchart further illustrating the driving of an output mode according to embodiments of the inventive concept.

FIG. 12 is a flowchart further illustrating the driving of the output node (S1120 of FIG. 11) according to embodiments of the inventive concept.

Referring to FIGS. 9, 10, 11 and 12, the transition signal generation circuit 70 may generate the plurality of transition signals T1 to T4 in response to a determination of whether the serial signal D_TX transitions (S1210). Here, the first transition signal T1 may indicate whether there is a logic level transition between a section of the first parallel signal D1 consecutive to a section of the fourth parallel signal D4 in the serial signals D_TX. The second transition signal T2 may indicate whether there is a logic level transition between a section of the second parallel signal D2 consecutive to a section of the first parallel signal D1 in the serial signals D_TX. The third transition signal T3 may indicate whether there is a logic level transition between a section of the third parallel signal D3 consecutive to a section of the second parallel signal D2 in the serial signals D_TX. The fourth transition signal T4 may indicate whether there is a logic level transition between a section of the fourth parallel signal D4 consecutive to a section of the third parallel signal D3 in the serial signals D_TX. When the serial signal D_TX transitions (S1210=YES) method step S1230 is performed, else when the serial signal D_TX does not transition, method step S1220 is performed.

In method step S1230, the transmitter circuit 2 may operate in a multi-driving mode in which two or more of the first to fourth selection circuits 61 to 64 drive the output node Nout. Because two or more selection circuits simultaneously drive the output node Nout, a slew rate of the serial signal D_TX may be increased, and the performance of the transmitter circuit 2 may be increased. Whereas, in method step S1220, the transmitter circuit 2 may operate in a single-driving mode in which one of the first to fourth selection circuits 61 to 64 drives the output node Nout. When there is no transition of the serial signal D_TX, only one selection circuit operates, and thus, power consumption may be reduced.

Figure 13:
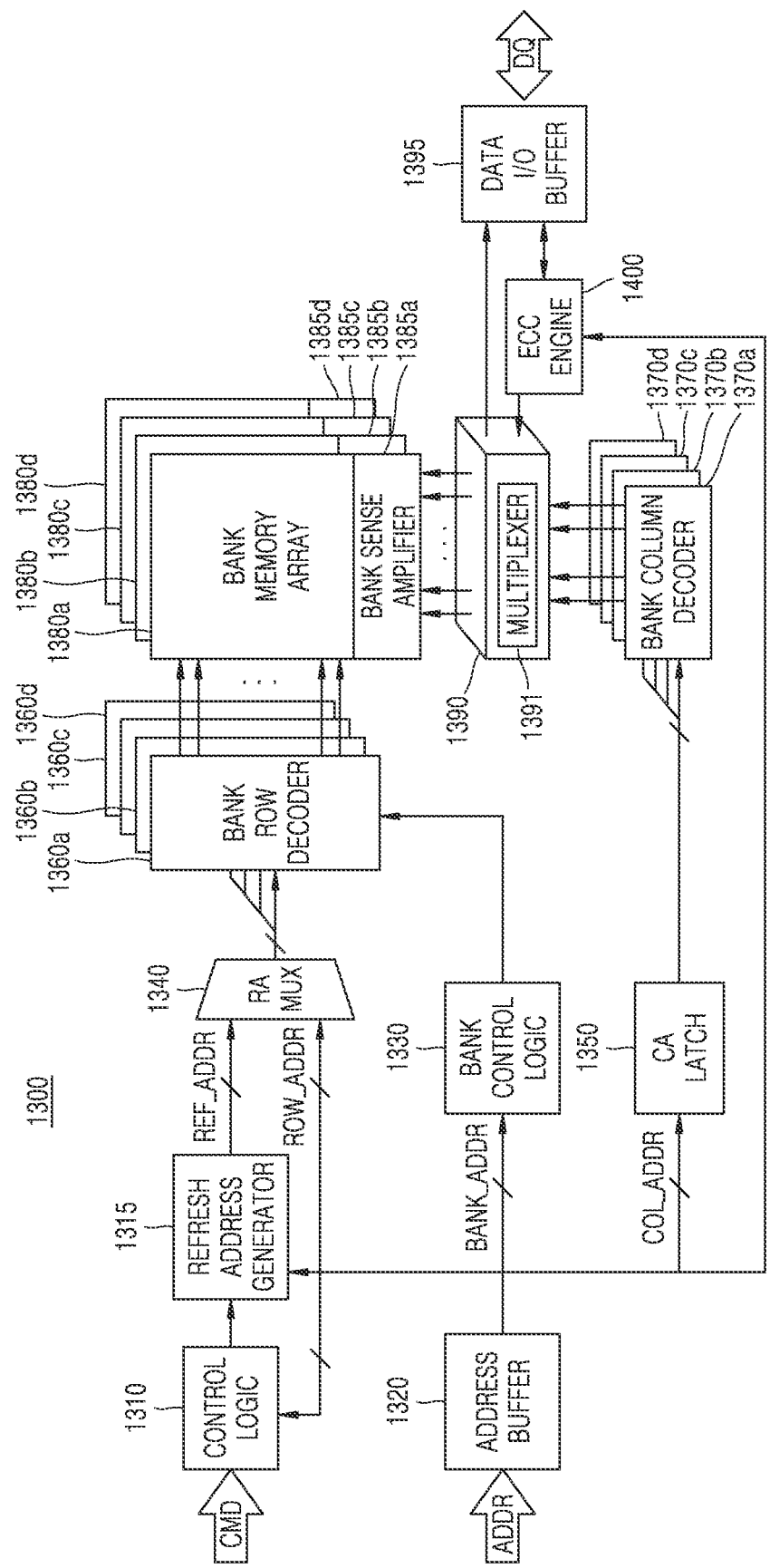
FIG. 13 is a block diagram illustrating a semiconductor memory device including a multiplexer according to embodiments of the inventive concept.

FIG. 13 is a block diagram illustrating a semiconductor memory device 1300 including a multiplexer according to embodiments of the inventive concept.

Referring to FIG. 13, the semiconductor memory device 1300 may include a control logic 1310, a refresh address generator 1315, an address buffer 1320, a bank control logic 1330, a row address multiplexer 1340, a column address latch 1350, a row decoder, a memory cell array, a sense amplifier, an input/output (I/O) gating circuit 1390, a data I/O buffer 1395, a column decoder, and an error checking and correction (ECC) engine 1400 may be included.

The memory cell array may include first to fourth bank memory arrays 1380a, 1380b, 1380c, and 1380d. The row decoder may include first to fourth bank row decoders 1360a, 1360b, 1360c, and 1360d respectively connected to the first to fourth bank memory arrays 1380a, 1380b, 1380c, and 1380d. The column decoder may include first to fourth bank column decoders 1370a, 1370b, 1370c, and 1370d respectively connected to the first to fourth bank memory arrays 1380a, 1380b, 1380c, and 1380d. The sense amplifier may include first to fourth bank sense amplifiers 1385a, 1385b, 1385c, and 1385d respectively connected to the first to fourth bank memory arrays 1380a, 1380b, 1380c, and 1380d. The first to fourth bank memory arrays 1380a, 1380b, 1380c, and 1380d, the first to fourth bank row decoders 1360a, 1360b, 1360c, and 1360d, the first to fourth bank column decoders 1370a, 1370b, 1370c, and 1370d, and the first to fourth bank sense amplifiers 1385a, 1385b, 1385c, and 1385d may respectively configure first to fourth banks. Although FIG. 13 illustrates an example of the semiconductor memory device 1300 including four banks, those skilled in the art will recognize that the semiconductor memory device 1300 may include any reasonable number of banks.

In addition, according to an example embodiment, the semiconductor memory device 1300 may include dynamic random access memory (DRAM) such as double data rate synchronous dynamic random access memory (DDR SDRAM), low power double data rate (LPDDR) SDRAM, graphics double data rate (GDDR) SDRAM, or Rambus dynamic random access memory (RDRAM), or any volatile memory device requiring a refresh operation.

The control logic 1310 may control an operation of the semiconductor memory device 1300. For example, the control logic 1310 may generate control signals for the semiconductor memory device 1300 to perform a write operation or a read operation. The control logic 1310 may include a command decoder (not shown) for decoding a command CMD received from a memory controller and a mode register (not shown) for setting an operation mode of the semiconductor memory device 1300. For example, the command decoder may generate control signals corresponding to the command CMD by decoding a write enable signal /WE, a row address strobe signal /RAS, a column address strobe signal /CAS, a chip select signal (/CS), and so on.

The control logic 1310 may further receive a clock signal CLK and a clock enable signal CKE for driving the semiconductor memory device 1300 in a synchronous manner. The control logic 1310 may control the refresh address generator 1315 to perform an auto-refresh operation in response to a refresh command or may control the refresh address generator 1315 to perform a self-refresh operation in response to a self-refresh entry command.

The refresh address generator 1315 may generate a refresh address REF_ADDR corresponding to a memory cell row on which a refresh operation is performed. The refresh address generator 1315 may generate the refresh address REF_ADDR at a refresh rate longer than a refresh period defined by the standard of the semiconductor memory device 1300. Accordingly, a refresh current and refresh power of the semiconductor memory device 1300 may be reduced.

The address buffer 1320 may receive an address ADDR including a bank address BANK_ADDR, a row address ROW_ADDR, and a column address COL_ADDR from the memory controller. In addition, the address buffer 1320 may provide the received bank address BANK_ADDR to the bank control logic 1330, provide the received row address ROW_ADDR to the row address multiplexer 1340, and provide the received column address COL_ADDR to the column address latch 1350.

The bank control logic 1330 may generate bank control signals in response to the bank address BANK_ADDR. In response to the bank control signals, a bank row decoder corresponding to the bank address BANK_ADDR among the first to fourth bank row decoders 1360a, 1360b, 1360c, and 1360d may be activated, and a bank column decoder corresponding to the bank address BANK_ADDR among the first to fourth bank column decoders 1370a, 1370b, 1370c, and 1370d may be activated.

The bank control logic 1330 may generate bank group control signals in response to the bank address BANK_ADDR for determining a bank group. In response to the bank group control signals, row decoders of a bank group corresponding to the bank address BANK_ADDR among the first to fourth bank row decoders 1360a, 1360b, 1360c, and 1360d may be activated, and column decoders of a bank group corresponding to the bank address BANK_ADDR among the first to fourth bank column decoders 1370a, 1370b, 1370c, and 1370d may be activated.

The row address multiplexer 1340 may receive the row address ROW_ADDR from the address buffer 1320 and receive the refresh row address REF_ADDR from the refresh address generator 1315. The row address multiplexer 1340 may selectively output the row address ROW_ADDR or the refresh row address REF_ADDR. The row address ROW_ADDR output from the row address multiplexer 1340 may be applied to the first to fourth bank row decoders 1360a, 1360b, 1360c, and 1360d.

A bank row decoder activated by the bank control logic 1330 among the first to fourth bank row decoders 1360a, 1360b, 1360c, and 1360d may decode the row address ROW_ADDR output from the row address multiplexer 1340 to activate a word line corresponding to the row address ROW_ADDR. For example, the activated bank row decoder may apply a word line driving voltage to the word line corresponding to the row address ROW_ADDR.

The column address latch 1350 may receive the column address COL_ADDR from the address buffer 1320 and temporarily store the received column address COL_ADDR. The column address latch 1350 may gradually increase the received column address COL_ADDR in a burst mode. The column address latch 1350 may apply the temporarily stored or gradually increased column address COL_ADDR to the first to fourth bank column decoders 1370a, 1370b, 1370c, and 1370d.

A bank column decoder activated by the bank control logic 1330 among the first to fourth bank column decoders 1370a, 1370b, 1370c, and 1370d may activate a sense amplifier corresponding to the bank address BANK_ADDR and the column address COL_ADDR through the I/O gating circuit 1390.

The I/O gating circuit 1390 may include circuits for gating input/output data, an input data mask logic, read data latches storing data output from the first to fourth bank memory arrays 1380a, 1380b, 1380c, and 1380d, and a write driver for writing data to the first to fourth bank memory arrays 1380a, 1380b, 1380c, and 1380d.

Data read from one of the first to fourth bank memory arrays 1380a, 1380b, 1380c, and 1380d may be sensed and amplified by a sense amplifier and stored in the read data latches. Data DQ stored in the read data latches may be provided to the memory controller through the data I/O buffer 1395. The data DQ written to one of the first to fourth bank memory arrays 1380a, 1380b, 1380c, and 1380d may be provided from the memory controller to the data I/O buffer 1395. The data DQ provided to the data I/O buffer 1395 may be written to one bank memory array through a write driver.

The I/O gating circuit 1390 may include a multiplexer 1391. The multiplexer 1391 may be one of the multiplexer 10 described above with reference to FIG. 1, the multiplexer 30 described above with reference to FIG. 8A, the multiplexer 40 described above with reference to FIG. 8B, the multiplexer 50 described above with reference to FIG. 8C, and the multiplexer 60 described above with reference to FIG. 9. Although not illustrated in FIG. 13, the I/O gating circuit 1390 may also include the transition signal generation circuit 70 of FIG. 9. The multiplexer 1391 may convert parallel read from the first to fourth bank memory arrays 1380a, 1380b, 1380c, and 1380d into a corresponding serial signal consistent with the embodiments previously described.

While the inventive concept has been particularly shown and described with reference to embodiments thereof, it will be understood that various changes in form and details may be made therein without departing from the spirit and scope of the following claims.

What is claimed is:

1. A transmitter circuit that receives parallel signals and outputs a serial signal in response to the parallel signals, the transmitter circuit comprising:
    a clock generator configured to generate first clock signals having different respective phases;
    a multiplexer including a plurality of selection circuits respectively configured to selectively provide at least two of the parallel signals to an output node in response to at least two of the first clock signals; and
    an output driver configured to generate the serial signal by amplifying a signal the output node,
    wherein each selection circuit of the plurality of selection circuits comprises:
        a first P-type transistor configured to precharge the output node in response to detecting a first parallel signal among the parallel signals having a first logic level and a second parallel signal among the parallel signals having the first logic level; and
        a first N-type transistor configured to discharge the output node in response to detecting the first parallel signal having a second logic level and a second parallel signal having the second logic level.

2. The transmitter circuit of claim 1, wherein at least two selection circuits of the plurality of the selection circuits provide the first parallel signal among the parallel signals to the output node in response to a preset one of the first clock signals.

3. The transmitter circuit of claim 2, wherein selection circuits other than the at least two selection circuits of the plurality of selection circuits are disconnected from the output node while the at least two selection circuits of the plurality of selection circuits provide the first parallel signal to the output node.

4. The transmitter circuit of claim 1, wherein the clock generator comprises:
   a multi phase clock generator configured to receive a reference clock signal and generate second clock signals having different respective phases by delaying the reference clock signal; and
   a duty control circuit configured to generate the first clock signals by adjusting duty ratios of the second clock signals.

5. The transmitter circuit of claim 4, wherein the clock generator controls duty ratios of the first clock signals to be inversely proportional to a total number of the selection circuits.

6. The transmitter circuit of claim 1, wherein each selection circuit of the plurality of selection circuits comprises:
   an AND-OR-inverter circuit configured to receive the first parallel signal, a first target clock signal corresponding to the first parallel signal among the first clock signals, the second parallel signal, and a second target clock signal corresponding to the second parallel signal among the first clock signals and drive the first P-type transistor; and
   an OR-AND-inverter circuit configured to receive the first parallel signal, a first inverted target clock signal obtained by inverting the first target clock signal, the second parallel signal, and a second inverted target clock signal obtained by inverting the second target clock signal and drive the first N-type transistor.

7. The transmitter circuit of claim 6, wherein the AND-OR-inverter circuit comprises:
   a first partial circuit configured to turn ON the first P-type transistor in response to detecting the first parallel signal having the first logic level and further in response to the first target clock signal; and
   a second partial circuit configured to turn ON the first P-type transistor in response to detecting the second parallel signal having the first logic level and further in response to the second target clock signal.

8. The transmitter circuit of claim 6, wherein the OR-AND-inverter circuit comprises:
   a third partial circuit configured to turn ON the first N-type transistor in response to detecting the first parallel signal having the second logic level and further in response to the first inverted target clock signal; and
   a fourth partial circuit configured to turn ON the first N-type transistor in response to detecting the second parallel signal having the second logic level and further in response to the second inverted target clock signal.

9. A method of operating a transmitter circuit to generate a serial signal from parallel signals, the method comprising:
   generating first clock signals having different respective phases in response to a reference clock signal;
   sequentially outputting the parallel signals by simultaneously driving an output node using at least two selection circuits among a plurality of selection circuits, wherein each of the at least two selection circuits operates in response to at least one of the first clock signals and receives at least two of the parallel signals; and
   generating the serial signal by amplifying a signal at the output node,
   wherein each selection circuit of the at least two selection circuits comprises:
      a first P-type transistor configured to precharge the output node in response to detecting a first parallel signal among the parallel signals having a first logic level and a second parallel signal among the parallel signals having the first logic level; and
      a first N-type transistor configured to discharge the output node in response to detecting the first parallel signal having a second logic level and a second parallel signal having the second logic level.

10. The method of claim 9, wherein the generating of the first clock signals comprises:
    generating second clock signals respectively having the same duty ratio as the reference clock signal and different phases; and
    generating the first clock signals by controlling duty ratios of the second clock signals to be inversely proportional to a total number of the selection circuits.

11. The method of claim 9, wherein the sequentially outputting of the parallel signals comprises simultaneously driving the output node using the at least two selection circuits in response to whether the serial signal transitions.

12. The method of claim 11, further comprising:
    driving the output node using one of the selection circuits when the serial signal does not transition, else simultaneously driving the output node using the at least two selection circuits when the serial signal transitions.

* * * * *